United States Patent
Oh

(10) Patent No.: US 11,842,977 B2
(45) Date of Patent: Dec. 12, 2023

(54) SEMICONDUCTOR PACKAGE

(71) Applicant: SAMSUNG ELECTRONICS CO., LTD., Suwon-si (KR)

(72) Inventor: Jooyoung Oh, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/446,074

(22) Filed: Aug. 26, 2021

(65) Prior Publication Data

US 2022/0208717 A1 Jun. 30, 2022

(30) Foreign Application Priority Data

Dec. 29, 2020 (KR) .................. 10-2020-0186781

(51) Int. Cl.
*H01L 23/00* (2006.01)
*H01L 25/065* (2023.01)
*H01L 23/538* (2006.01)

(52) U.S. Cl.
CPC .......... *H01L 24/48* (2013.01); *H01L 23/5389* (2013.01); *H01L 24/05* (2013.01); *H01L 24/49* (2013.01); *H01L 24/73* (2013.01); *H01L 25/0657* (2013.01); *H01L 2224/05552* (2013.01); *H01L 2224/4809* (2013.01); *H01L 2224/48227* (2013.01); *H01L 2224/73265* (2013.01); *H01L 2225/1035* (2013.01)

(58) Field of Classification Search
CPC ............. H01L 24/49; H01L 2225/1035; H01L 23/5389
See application file for complete search history.

(56) References Cited

U.S. PATENT DOCUMENTS

| | | | |
|---|---|---|---|
| 7,947,908 B2 | 5/2011 | Mizuno et al. | |
| 9,190,386 B2 | 11/2015 | Su | |
| 9,693,462 B2 | 6/2017 | Hosomi | |
| 10,242,964 B1* | 3/2019 | Lin | ............ H01L 21/481 |
| 10,638,769 B2 | 4/2020 | Teh et al. | |
| 2015/0235994 A1 | 8/2015 | Ohba et al. | |
| 2018/0190776 A1* | 7/2018 | Gogineni | ............ H01L 24/49 |

FOREIGN PATENT DOCUMENTS

| | | |
|---|---|---|
| JP | 1996-023151 | 1/1996 |
| KR | 10-02586060 | 3/2000 |
| KR | 10-07099630 | 4/2007 |
| KR | 10-2012-0033848 | 4/2012 |
| KR | 10-1440327 | 9/2014 |

* cited by examiner

*Primary Examiner* — Yu-Hsi D Sun
(74) *Attorney, Agent, or Firm* — F. CHAU & ASSOCIATES, LLC

(57) ABSTRACT

A semiconductor package includes a package substrate which includes a substrate base and a plurality of wiring patterns, a lower semiconductor chip, and an upper semiconductor chip. The substrate base includes a chip-accommodating cavity and the plurality of wiring patterns include a plurality of bottom wiring patterns on a bottom surface of the substrate base and a plurality of top wiring patterns on a top surface of the substrate base. The lower semiconductor chip is disposed in the chip-accommodating cavity and is connected to the plurality of bottom wiring patterns through a plurality of lower bonding wires. The upper semiconductor chip includes a first portion which is attached to the lower semiconductor chip and a second portion which overhangs the lower semiconductor chip.

12 Claims, 19 Drawing Sheets

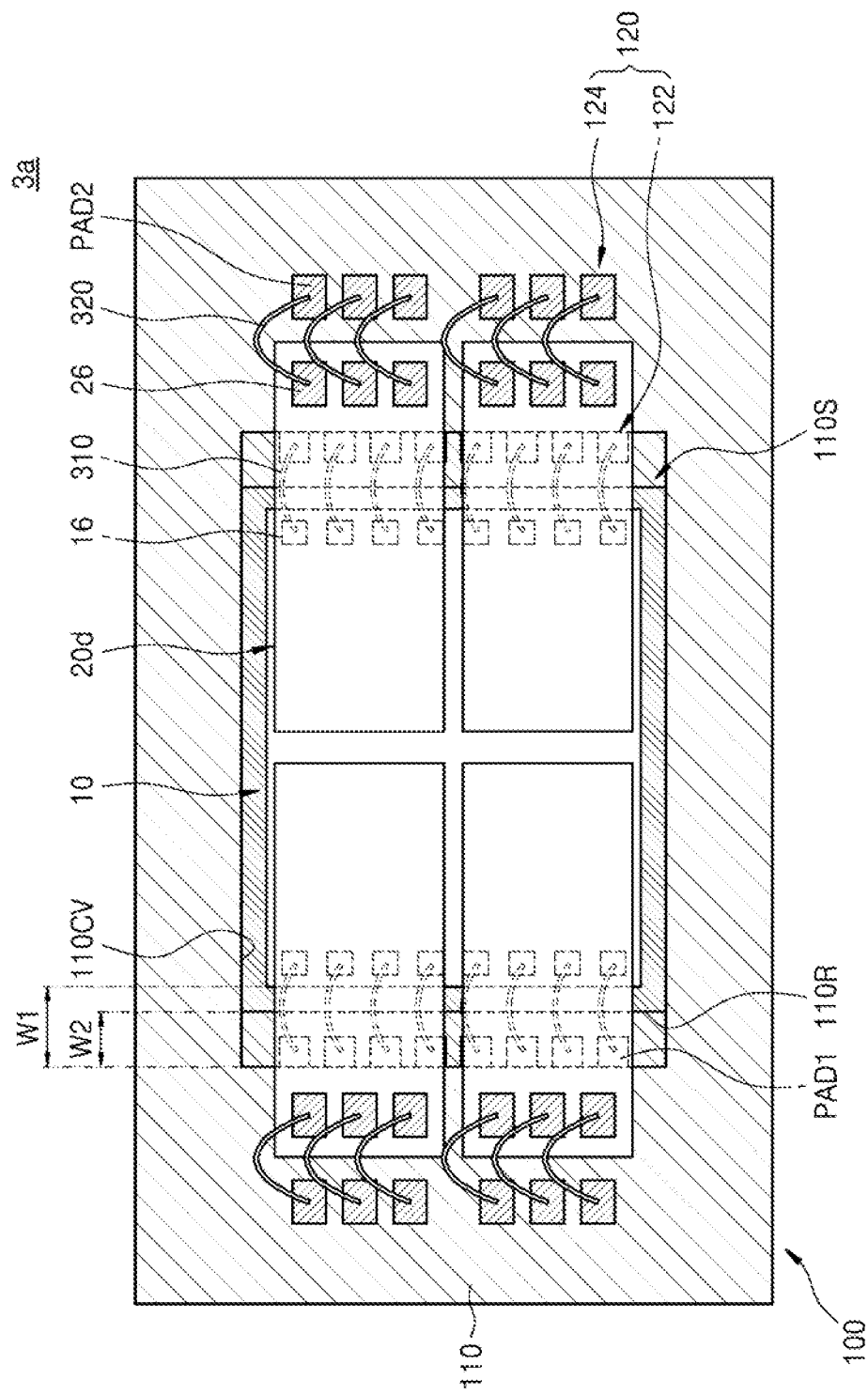

SEMICONDUCTOR PACKAGE

CROSS-REFERENCE TO RELATED APPLICATIONS

This patent application claims priority under 35 U.S.C. § 119 to Korean Patent Application No. 10-2020-0186781, filed on Dec. 29, 2020 in the Korean Intellectual Property Office, the disclosure of which is incorporated by reference herein in its entirety.

TECHNICAL FIELD

Embodiments of the inventive concept relate to a semiconductor package, and more particularly, to a semiconductor package that includes a plurality of semiconductor chips.

DISCUSSION OF RELATED ART

With the rapid development of the electronics industry and increasing user needs, electronic products have become more compact and multifunctional. Accordingly, semiconductor packages mounted on electronic products should have a smaller volume while having various functions. Therefore, semiconductor packages including a plurality of semiconductor chips are being developed.

SUMMARY

Embodiments of the inventive concept provide a semiconductor package including a plurality of semiconductor chips.

According to an embodiment of the inventive concept, a semiconductor package includes a package substrate including a substrate base and a plurality of wiring patterns, a lower semiconductor chip, and an upper semiconductor chip. The substrate base includes a chip-accommodating cavity and the plurality of wiring patterns include a plurality of bottom wiring patterns on a bottom surface of the substrate base and a plurality of top wiring patterns on a top surface of the substrate base. The lower semiconductor chip is disposed in the chip-accommodating cavity and is connected to the plurality of bottom wiring patterns through a plurality of lower bonding wires. The upper semiconductor chip includes a first portion which is attached to the lower semiconductor chip and a second portion which overhangs the lower semiconductor chip.

According to an embodiment of the inventive concept, a semiconductor package includes a package substrate, at least one semiconductor chip, and at least one upper semiconductor chip. The package substrate includes a substrate base and a plurality of wiring patterns. The substrate base includes a chip-accommodating cavity, at least one bonding recess which contacts the chip-accommodating cavity, and at least one chip support which is defined by the chip-accommodating cavity and the at least one bonding recess. The plurality of wiring patterns includes a plurality of bottom wiring patterns on a bottom surface of the substrate base and a plurality of top wiring patterns on a top surface of the substrate base. The plurality of bottom wiring patterns includes a plurality of terminal pads and a plurality of lower bonding pads which are disposed in a bottom of the at least one bonding recess. The plurality of top wiring patterns include a plurality of upper bonding pads. The at least one lower semiconductor chip is disposed in the chip-accommodating cavity and is attached to the at least one chip support. The at least one lower semiconductor chip includes a plurality of first chip pads which are connected to the plurality of lower bonding pads through a plurality of lower bonding wires. The at least one upper semiconductor chip is attached across the at least one lower semiconductor chip and the substrate base.

According to an embodiment of the inventive concept, a semiconductor package includes a package substrate, a lower semiconductor chip, an upper semiconductor chip, a plurality of lower bonding wires, a plurality of upper bonding wires, a molding layer, and a plurality of external connection terminals. The package substrate includes a substrate base and a plurality of wiring patterns. The substrate base includes a chip-accommodating cavity, a bonding recess which contacts the chip-accommodating cavity and includes a bottom disposed at a vertical level which is lower than a bottom of the chip-accommodating cavity, and a chip support which is provided by the chip-accommodating cavity and the bonding recess. The plurality of wiring patterns includes a plurality of bottom wiring patterns on a bottom surface of the substrate base and a plurality of top wiring patterns on a top surface of the substrate base. The plurality of bottom wiring patterns includes a plurality of terminal pads which are disposed at a same vertical level as each other and a plurality of lower bonding pads which are disposed in the bottom of the bonding recess. The plurality of top wiring patterns include a plurality of upper bonding pads. The lower semiconductor chip is disposed in the chip-accommodating cavity and includes a plurality of first chip pads on a top surface thereof. The lower semiconductor chip is attached to the chip support by a lower die adhesive film which has a first thickness between the lower semiconductor chip and the chip support. The upper semiconductor chip includes a plurality of second chip pads on a top surface thereof and is attached across the top surface of the lower semiconductor chip and the top surface of the substrate base by an upper die adhesive film which has a second thickness between the upper semiconductor chip and the top surfaces of the lower semiconductor chip and the substrate base. The second thickness is greater than the first thickness. The plurality of lower bonding wires connect the plurality of lower bonding pads to the plurality of first chip pads, and at least one of the plurality of lower bonding wires is partially covered by the upper die adhesive film. The plurality of upper bonding wires connect the plurality of upper bonding pads to the plurality of second chip pads. The molding layer covers a top surface of the package substrate, fills the chip-accommodating cavity and the bonding recess, and covers the lower semiconductor chip, the plurality of lower bonding wires, the upper semiconductor chip, and the plurality of upper bonding wires. The plurality of external connection terminals are attached to the plurality of terminal pads.

BRIEF DESCRIPTION OF THE DRAWINGS

The above and other features of the inventive concept will become more apparent by describing in detail embodiments thereof with reference to the accompanying drawings, in which:

FIGS. 7A and 7B are plan views of semiconductor packages according to embodiments of the inventive concept;

DETAILED DESCRIPTION

Figure 1A:
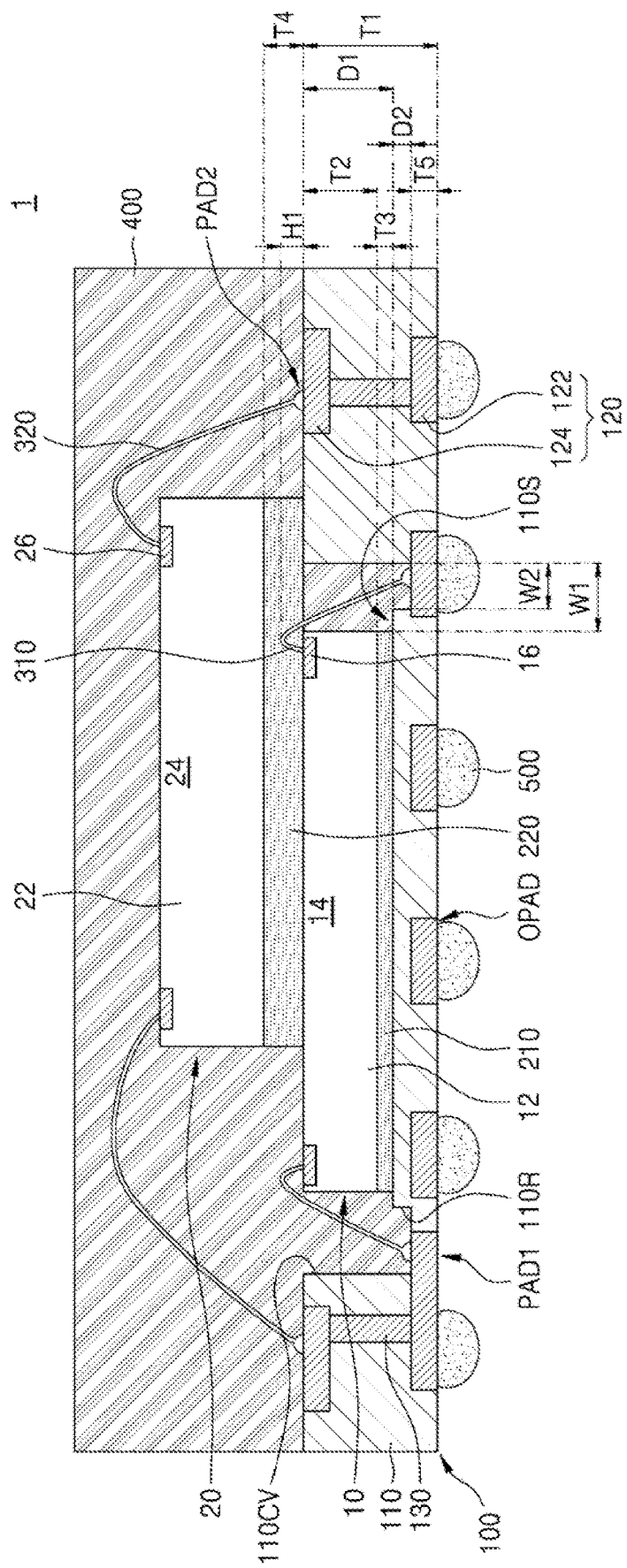
FIGS. 1A and 1B are respectively a cross-sectional view and a plan view of a semiconductor package according to an embodiment of the inventive concept.

Embodiments of the inventive concept will be described more fully hereinafter with reference to the accompanying drawings. Like reference numerals may refer to like elements throughout the accompanying drawings. As used herein, the singular forms "a", "an", and "the" are intended to include the plural forms as well, unless the context clearly indicates otherwise.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the embodiments.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to the embodiments, the parameter may be exactly the certain value or approximately the certain value within a measurement error as would be understood by a person having ordinary skill in the art.

Figure 1B:
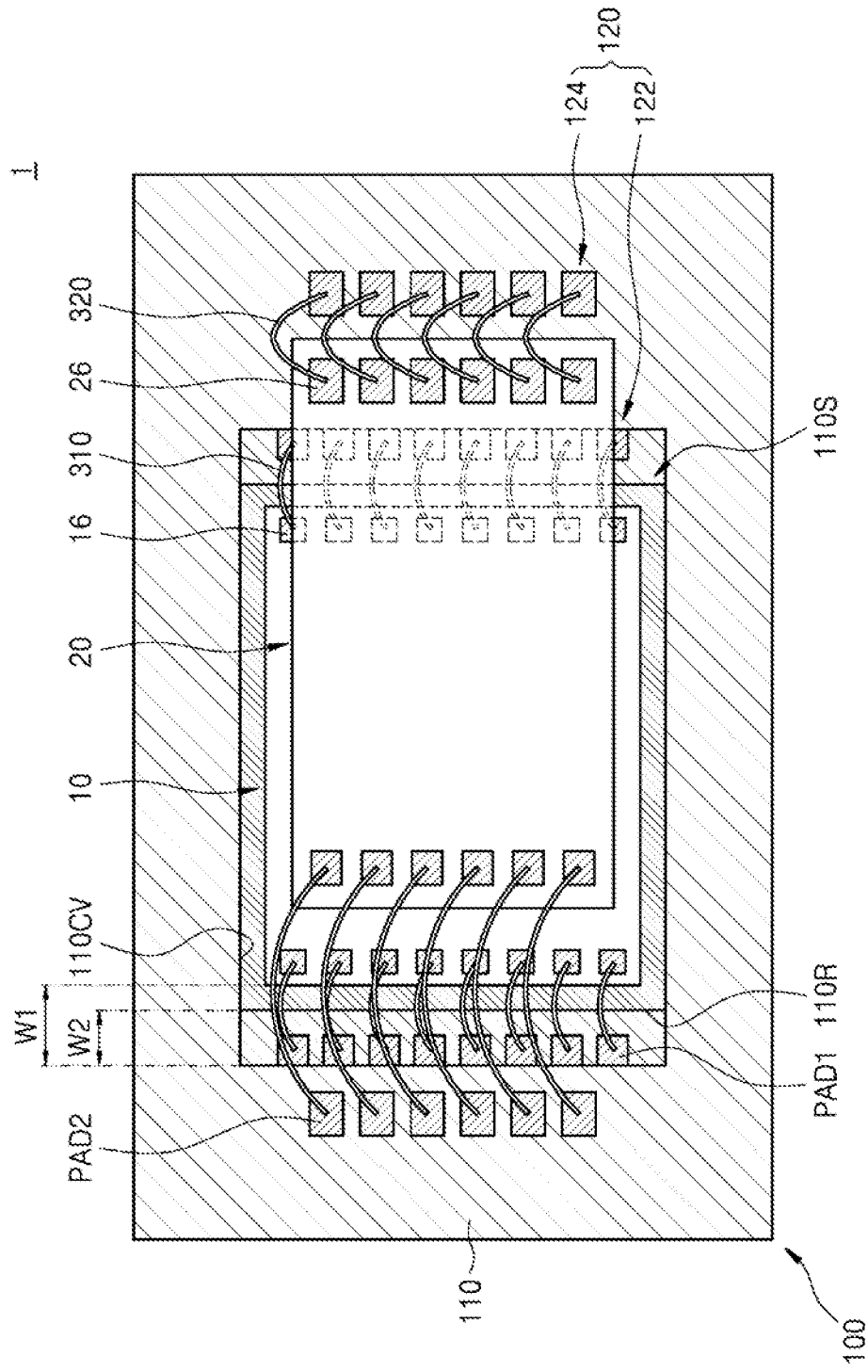

FIGS. 1A and 1B are respectively a cross-sectional view and a plan view of a semiconductor package 1 according to an embodiment of the inventive concept.

Referring to FIGS. 1A and 1B, the semiconductor package 1 can include a package substrate 100, a lower semiconductor chip 10 disposed in the package substrate 100, and an upper semiconductor chip 20 disposed on the package substrate 100 and the lower semiconductor chip 10.

The package substrate 100 can include a substrate base 110, a plurality of wiring patterns 120, and a plurality of conductive vias 130.

The substrate base 110 can include at least one material selected from phenol resin, epoxy resin, polyimide, frame retardant 4 (FR-4), tetrafunctional epoxy, polyphenylene ether, epoxy/polyphenylene oxide, bismaleimide triazine (BT), thermount, cyanate ester, or liquid crystal polymer. In some embodiments, the substrate base 110 may be formed by stacking a plurality of base layers, which can include at least one material selected from phenol resin, epoxy resin, polyimide, frame retardant 4 (FR-4), tetrafunctional epoxy, polyphenylene ether, epoxy/polyphenylene oxide, bismaleimide triazine (BT), thermount, cyanate ester, or liquid crystal polymer.

The wiring patterns 120 can include electrolytically deposited (ED) copper foil, rolled-annealed (RA) copper foil, stainless steel foil, aluminum foil, ultra-thin copper foil, sputtered copper, or a copper alloy.

The wiring patterns 120 can include a plurality of bottom wiring patterns 122 disposed on a bottom surface of the substrate base 110 and a plurality of top wiring patterns 124 disposed on a top surface of the substrate base 110. In some embodiments, when the substrate base 110 is formed by stacking a plurality of base layers, some of the wiring patterns 120 may be disposed between two adjacent base layers among the plurality of base layers. A region in which some of the wiring patterns 120 are arranged at the same vertical level as each other, among the bottom and top surfaces of the substrate base 110 and between two adjacent base layers, may be referred to as a layer. For example, the package substrate 100 may include two layers respectively disposed at the bottom and top surfaces of the substrate base 110. In some embodiments, the substrate base 110 can be formed by two stacked base layers, and three layers may be respectively disposed at the bottom of the substrate base 110, at the top surface of the substrate base 110, and between the two base layers.

In some embodiments, the bottom wiring patterns 122 and the top wiring patterns 124 can be at least partially covered by the substrate base 110. For example, bottom surfaces of the bottom wiring patterns 122 may be coplanar with the bottom surface of the substrate base 110 at the same vertical level, and top surfaces of the top wiring patterns 124 may be coplanar with the top surface of the substrate base 110 at the same vertical level.

An external connection terminal 500 can be attached to a bottom surface of each of some of the bottom wiring patterns 122. A portion of a bottom wiring pattern 122 to which the external connection terminal 500 is attached may be referred to as a terminal pad OPAD. A lower bonding wire 310 can be connected to a top surface of each of some of the bottom wiring patterns 122. A portion of a bottom wiring pattern 122 to which the lower bonding wire 310 is connected may be referred to as a lower bonding pad PAD1. Each of the terminal pad OPAD and the lower bonding pad PAD1 can be a portion of a bottom wiring pattern 122, and accordingly, the terminal pad OPAD can be disposed at the same vertical level as the lower bonding pad PAD1. In some embodiments, the terminal pad OPAD can have a rectangular or circular shape and can have a maximum horizontal width of about 50 μm to about 200 μm.

The plurality of bottom wiring patterns 122 can include a plurality of terminal pads OPAD and a plurality of lower bonding pads PAD1. A plurality of external connection terminals 500 can be respectively attached to the terminal pads OPAD. The external connection terminals 500 can electrically connect the semiconductor package 1 to an external device. In some embodiments, each of the external connection terminals 500 can include a conductive bump.

In some embodiments, a terminal pad OPAD and a lower bonding pad PAD1 can be respectively included in different bottom wiring patterns 122, but embodiments of the inventive concept are not necessarily limited thereto. In some embodiments, at least a portion of a terminal pad OPAD and at least a portion of a lower bonding pad PAD1 can respectively correspond to the bottom and top surfaces of each of a group of bottom wiring patterns 122.

An upper bonding wire 320 can be connected to a top surface of each of some of the top wiring patterns 124. A portion of a top wiring pattern 124 to which the upper bonding wire 320 is connected may be referred to as an upper bonding pad PAD2. A plurality of top wiring patterns 124 can include a plurality of upper bonding pads PAD2.

A metal layer can be formed on each of the terminal pads OPAD, the lower bonding pads PAD1, and the upper bonding pads PAD2. The metal layer can increase the adhesive strength of each of the terminal pads OPAD, the lower bonding pads PAD1, and the upper bonding pads PAD2 and decrease the contact resistance thereof. For example, the metal layer may be formed via hot air solder leveling (HASL) or Ni/Au plating. In some embodiments, the metal layer can be formed on the terminal pads OPAD but not on the lower bonding pads PAD1 and the upper bonding pads PAD2.

Each of the conductive vias 130 can electrically connect wiring patterns 120 disposed at different layers. Each conductive via 130 can pass through at least a portion of the substrate base 110. For example, a conductive via 130 can connect a bottom wiring pattern 122 to a top wiring pattern 124. In some embodiments, when the substrate base 110 includes a stack of base layers, the conductive via 130 can pass through at least one of the base layers. For example, a bottom wiring pattern 122 may be electrically connected to a top wiring pattern 124 through at least one conductive via 130 which pass through at least two adjacent base layers among a plurality of base layers. A conductive via 130 can include a material such as copper, nickel, stainless steel, beryllium copper, or the like.

In some embodiments, a solder resist layer can be formed on the bottom surface of the substrate base 110 or on each of the bottom and top surfaces of the substrate base 110. The solder resist layer on the bottom surface of the substrate base 110 can expose the terminal pads OPAD. The solder resist layer on the bottom surface of the substrate base 110 can expose the upper bonding pads PAD2.

The substrate base 110 can include a chip-accommodating cavity 110CV and at least one bonding recess 110R which can contact the chip-accommodating cavity 110CV. The substrate base 110 can have a first thickness T1 between the bottom and top surfaces thereof. For example, the first thickness T1 may be about 150 μm to about 250 □μm.

The chip-accommodating cavity 110CV can extend from the top surface of the substrate base 110 toward the bottom surface of the substrate base 110. The chip-accommodating cavity 110CV can have a first depth D1 between the top surface of the substrate base 110 and a bottom of the chip-accommodating cavity 110CV. The first depth D1 can be less than the first thickness T1. For example, the first depth D1 may be about 100 μm to about 150 μm. In some embodiments, the chip-accommodating cavity 110CV can extend from the top surface of the substrate base 110 towards the bottom surface of the substrate base 110, but might not contact the bottom surface of the substrate base 110. For example, the bottom of the chip-accommodating cavity 110CV may be at a higher vertical level than the bottom surface of the substrate base 110. The chip-accommodating cavity 110CV can have a rectangular shape.

The bonding recess 110R can extend from the bottom of the chip-accommodating cavity 110CV toward the bottom surface of the substrate base 110. In some embodiments, the bonding recess 110R might not contact the bottom surface of the substrate base 110. For example, the bottom of the bonding recess 110R may be at a vertical level that is lower than the vertical level of the bottom of the chip-accommodating cavity 110CV and is higher than the vertical level of the bottom surface of the substrate base 110. The lower bonding pads PAD1 can be exposed through the bottom of the bonding recess 110R. In some embodiments, the lower bonding pads PAD1 and a portion of the substrate base 110 can be exposed through the bottom of the bonding recess 110R.

The bonding recess 110R can have a rectangular shape or a bar shape extending in a horizontal direction. In some embodiments, the substrate base 110 can include two bonding recesses 110R which can contact the chip-accommodating cavity 110CV. For example, two bonding recesses 110R may be respectively adjacent to opposite sides of the chip-accommodating cavity 110CV from each other.

At least one bonding recess 110R can have a second depth D2 between the bottom of the chip-accommodating cavity 110CV and the bottom of the bonding recess 110R. The sum of the first depth D1 and the second depth D2 can be less than the first thickness T1. For example, the second depth D2 may be about 30 μm to about 80 μm.

The substrate base 110 can include a chip support 110S which can be defined by the chip-accommodating cavity 110CV and the bonding recess 110R. The chip support 110S can have a rectangular shape. The top surface of the chip support 110S can be coplanar with the bottom of the chip-accommodating cavity 110CV at the same vertical level. The thickness of the chip support 110S can be equal to the second depth D2. A first portion of the edge of the chip support 110S can contact a side wall of the chip-accommodating cavity 110CV, and a second portion of the edge of the chip support 110S can be spaced apart from the side wall of the chip-accommodating cavity 110CV and contact a side wall of the bonding recess 110R.

The lower semiconductor chip 10 can be disposed in the chip-accommodating cavity 110CV. The lower semiconductor chip 10 can be attached to the chip support 110S with a lower die adhesive film 210 which can be disposed between the lower semiconductor chip 10 and the chip support 110S. The lower semiconductor chip 10 can include a first semiconductor substrate 12, which can include a first semiconductor device 14 on an active surface thereof, and a plurality of first chip pads 16 disposed on the active surface of the first semiconductor substrate 12. The lower semiconductor chip 10 can be attached to the top surface of the chip support 110S by the lower die adhesive film 210, which can be attached to an inactive surface of the first semiconductor substrate 12 so as to have a face-up placement such that the active surface of the first semiconductor substrate 12 faces upwards. The lower semiconductor chip 10 can have a second thickness T2. The second thickness T2 can be less than the first thickness T1. The lower die adhesive film 210 can have a third thickness T3. The sum of the second thickness T2 and the third thickness T3 can be equal to the first depth D1. In other words, the second thickness T2 can be less than the first depth D1. For example, the second thickness T2 may be about 50 μm to about 100 μm. For example, the third thickness T3 may be about 10 μm to about 30 μm.

In an embodiment, the entirety of the lower semiconductor chip 10 can be disposed in the chip-accommodating cavity 110CV. However, embodiments of the inventive concept are not limited thereto. The lower semiconductor chip 10 can be spaced apart from a side wall of the chip-accommodating cavity 110CV when disposed in the chip-accommodating cavity 110CV. The top surface of the lower semiconductor chip 10 can be coplanar with the top surface of the substrate base 110 at the same vertical level.

A plurality of lower bonding wires 310 can be connected between the first chip pads 16 of the lower semiconductor chip 10 and the lower bonding pads PAD1. In other words, a first end of each of the lower bonding wires 310 can be connected to a corresponding first chip pad 16, and a second end opposite to the first end of each of the lower bonding wires 310 can be connected to a corresponding lower bonding pad PAD1. The lower bonding wires 310 may protrude upwards from the top surface of the lower semiconductor chip 10 by a first height H1. For example, the first height H1 may be about 20 μm to about 60 μm.

In some embodiments, each first chip pad 16 may be disposed in a portion of the lower semiconductor chip 10 which is adjacent to either of opposite ends of the top surface of the lower semiconductor chip 10. For example, a first group of the first chip pads 16 may be disposed in a portion of the lower semiconductor chip 10 which is adjacent to a first end of the top surface of the lower semiconductor chip 10, and a second group of the first chip pads 16 may be disposed in a portion of the lower semiconductor chip 10 which is adjacent to a second end opposite to the first end of the top surface of the lower semiconductor chip 10.

A plurality of lower bonding wires 310 can respectively connect a plurality of first chip pads 16, which can be adjacent to each of two edges among the four edges of the top surface of the lower semiconductor chip 10, to a plurality of lower bonding pads PAD1 which can be exposed in the bottom of either of two bonding recesses 110R respectively adjacent to the opposite ends of the top surface of the lower semiconductor chip 10. In other words, each of the lower bonding wires 310 can connect a corresponding first chip pad 16 to a corresponding lower bonding pad PAD1 across either of the two edges among the four edges of the top surface of the lower semiconductor chip 10.

An edge of the lower semiconductor chip 10 adjacent to the first chip pads 16 can be spaced apart from a side wall of the chip-accommodating cavity 110CV by a first width W1. The lower semiconductor chip 10 and the side wall of the chip-accommodating cavity 110CV can have a bonding recess 110R disposed therebetween and spaced apart from each other by the first width W1. For example, the first width may be at least about 100 μm. The bonding recess 110R can be disposed between an edge of the chip support 110S and the chip-accommodating cavity 110CV, and the edge of the chip support 110S and the chip-accommodating cavity 110CV can be spaced apart from each other by a second width W2. For example, the second width W2 may be greater than about 80 μm. In some embodiments, the first width W1 can be greater than the second width W2. For example, a horizontal area of the chip support 110S may be equal to a horizontal area of the lower semiconductor chip 10. For example, the edge of the chip support 110S may entirely overlap the edge of the lower semiconductor chip 10 in a vertical direction. However, embodiments of the inventive concept are not limited thereto. In some embodiments, the first width W1 can be equal to the second width W2. For example, an edge of the chip support 110S may be spaced apart from an edge of the lower semiconductor chip 10.

The upper semiconductor chip 20 can be attached across the package substrate 100 and the lower semiconductor chip 10. The upper semiconductor chip 20 can be attached across the package substrate 100 and the lower semiconductor chip 10 with an upper die adhesive film 220 disposed between the upper semiconductor chip 20 and each of the package substrate 100 and the lower semiconductor chip 10. The upper semiconductor chip 20 can be attached across the top surface of the substrate base 110 of the package substrate 100 and the top surface of the lower semiconductor chip 10 by the upper die adhesive film 220 disposed between the upper semiconductor chip 20 and each of the top surfaces of the substrate base 110 and the lower semiconductor chip 10.

The upper semiconductor chip 20 can include a second semiconductor substrate 22, which can include a second semiconductor device 24 disposed on an active surface thereof, and a plurality of second chip pads 26 disposed on the active surface of the second semiconductor substrate 22. The upper semiconductor chip 20 can be attached across the top surfaces of the substrate base 110 and the lower semiconductor chip 10 by the upper die adhesive film 220, which can be attached to an inactive surface of the second semiconductor substrate 22 so as to have a face-up placement such that the active surface of the second semiconductor substrate 22 faces upwards.

The upper semiconductor chip 20 can have a rectangular shape. A first of four edges of the upper semiconductor chip 20 can entirely overlap the top surface of the substrate base 110 in the vertical direction, and a second of the four edges of the upper semiconductor chip 20 can entirely overlap the lower semiconductor chip 10 in the vertical direction. A first portion of each of the third and fourth edges of the upper semiconductor chip 20 can overlap the top surface of the substrate base 110 in the vertical direction, a second portion of each of the third and fourth edges of the upper semiconductor chip 20 can overlap the lower semiconductor chip 10, and a third portion of each of the third and fourth edges of the upper semiconductor chip 20 can overhang at least one bonding recess 110R and a portion of the chip-accommodating cavity 110CV in which the lower semiconductor chip 10 can be omitted.

In this specification, unless otherwise indicated, the top surface of the substrate base 110 may refer to the top surface of a portion of the substrate base 110, i.e., the topmost surface of the substrate base 110, in which the chip-accommodating cavity 110CV and the bonding recess 110R can be omitted.

Each of the first semiconductor substrate 12 and the second semiconductor substrate 22 include a semiconductor material such as silicon (Si) or germanium (Ge). However, embodiments of the inventive concept are not limited thereto. For example, each of the first semiconductor substrate 12 and the second semiconductor substrate 22 may include a compound semiconductor such as silicon carbide (SiC), gallium arsenide (GaAs), indium arsenide (InAs), or indium phosphide (InP). Each of the first semiconductor substrate 12 and the second semiconductor substrate 22 may include a conductive region, e.g., an impurity-doped well. Each of the first semiconductor substrate 12 and the second semiconductor substrate 22 may include various isolation structures, such as a shallow trench isolation (STI) structure.

The first semiconductor device 14 and the second semiconductor device 24, which may include various individual devices, can be respectively formed in the active surface of the first semiconductor substrate 12 and the active surface of the second semiconductor substrate 22. The various individual devices can include various microelectronic devices. For example, the various individual devices may be a metal-oxide-semiconductor field effect transistor (MOSFET) such as a complementary metal-oxide-semiconductor (CMOS) transistor, a system large scale integration (LSI), an active element, a passive element, or the like. The various individual devices can be electrically connected to the conductive region of each of the first semiconductor substrate 12 and the second semiconductor substrate 22. Each of the first semiconductor device 14 and the second semiconductor device 24 can further include a conductive wiring or plug which can electrically connect the various individual devices or at least two individual devices of the various individual devices to a corresponding conductive region of the first semiconductor substrate 12 and the second semiconductor substrate 22. Each of the various individual devices can be electrically isolated from each other by an insulating film.

In some embodiments, the lower semiconductor chip 10 can include a central processing unit (CPU) chip, a graphics processing unit (GPU) chip, or an application processor (AP) chip, and the upper semiconductor chip 20 can include a semiconductor memory chip.

Examples of the semiconductor memory chip may include a dynamic random access memory (DRAM) chip, a static RAM (SRAM) chip, a flash memory chip, an electrically erasable and programmable ROM (EEPROM) chip, a phase-change RAM (PRAM) chip, a magnetic RAM (MRAM) chip, a resistive RAM (RRAM) chip, or the like.

In some embodiments, the lower semiconductor chip 10 can include a semiconductor memory chip that can have a higher operation speed than the upper semiconductor chip 20, and the upper semiconductor chip 20 can include a semiconductor memory chip that can have a lower operation speed than the lower semiconductor chip 10. For example, the lower semiconductor chip 10 may include a DRAM chip, and the upper semiconductor chip 20 may include a NAND flash memory chip.

In some embodiments, the package substrate 100 can include a plurality of lower semiconductor chips 10, each selected from a group including a CPU chip, a GPU chip, and an AP chip, and at least one semiconductor memory chip that can have a relatively high operation speed. In some embodiments, the upper semiconductor chip 20 can include a semiconductor memory chip that can have a relatively low operation speed.

In an embodiment, each of the lower die adhesive film 210 and the upper die adhesive film 220 can include an inorganic adhesive or a polymer adhesive. For example, the polymer adhesive may include a thermosetting polymer or a thermoplastic polymer. A thermosetting polymer has a three-dimensional cross-link structure after monomers are heated, and is not softened when reheated. In contrast, a thermoplastic polymer displays plasticity when heated and has a linear polymer structure. The polymer adhesive can include a hybrid type produced by mixing these two types of polymers.

The upper die adhesive film 220 can have a fourth thickness T4. The fourth thickness T4 can be greater than the third thickness T3. The fourth thickness T4 can be greater than or equal to the first height H1. For example, the fourth thickness T4 can be about 30 μm to about 70 μm. Some of the lower bonding wires 310 can be at least partially covered by the upper die adhesive film 220. For example, a portion of a lower bonding wire 310 connected to a first chip pad 16 which overlaps the upper semiconductor chip 20 in the vertical direction can be at least partially covered by the upper die adhesive film 220. Although FIG. 1A illustrates that some of the lower bonding wires 310 are spaced apart from the bottom surface of the upper semiconductor chip 20 such that the fourth thickness T4 is greater than the first height H1, embodiments of the inventive concept are not limited thereto. For example, some of the lower bonding wires 310 may contact the bottom surface of the upper semiconductor chip 20 such that the fourth thickness T4 is equal to the first height H1.

In an embodiment, a plurality of bottom wiring patterns 122 can have a fifth thickness T5. The fifth thickness T5 may be about 10 μm to about 25 μm. A plurality of top wiring patterns 124 can have substantially the same thickness as the bottom wiring patterns 122.

A first portion of the upper semiconductor chip 20 can be attached to the top surface of the package substrate 100, and a second portion of the upper semiconductor chip 20 can be attached to the top surface of the lower semiconductor chip 10, and a third portion of the upper semiconductor chip 20 can overhang the chip-accommodating cavity 110CV. The third portion of the upper semiconductor chip 20, which can overhang the chip-accommodating cavity 110CV, can be partially attached to the top surface of the lower semiconductor chip 10. In other words, the second portion of the upper semiconductor chip 20 can be attached to the top surface of the lower semiconductor chip 10, and the third portion of the upper semiconductor chip 20 can overhang the lower semiconductor chip 10. The third portion of the upper semiconductor chip 20, which can overhang the lower semiconductor chip 10, can be partially attached to the top surface of a portion of the package substrate 100, which can be adjacent to the chip-accommodating cavity 110CV.

A plurality of upper bonding wires 320 can be respectively connected between the second chip pads 26 and the upper bonding pads PAD2. In other words, a first end of each of the upper bonding wires 320 can be connected to a corresponding second chip pad 26, and a second end opposite to the first end of each of the upper bonding wires 320 can be connected to a corresponding upper bonding pad PAD2.

The semiconductor package 1 can further include a molding layer 400 which can at least partially cover the top surface of the package substrate 100 and surround the lower semiconductor chip 10, the lower bonding wires 310, the upper semiconductor chip 20, and the upper bonding wires 320. The molding layer 400 can at least partially fill the chip-accommodating cavity 110CV and the bonding recess 110R. In an embodiment, the molding layer 400 can include an epoxy mold compound (EMC). In some embodiments, a side surface of the molding layer 400 and a corresponding side surface of the package substrate 100 can be aligned and coplanar with each other in the vertical direction.

In an embodiment, the lower semiconductor chip 10 of the semiconductor package 1 can be completely disposed in the chip-accommodating cavity 110CV of the substrate base 110 and thus be covered by the package substrate 100.

In an embodiment, the upper semiconductor chip 20 of the semiconductor package 1 can be attached across the top surface of the package substrate 100 and the top surface of the lower semiconductor chip 10. Accordingly, the second portion of the upper semiconductor chip 20 can be attached to the top surface of the lower semiconductor chip 10, and the third portion of the upper semiconductor chip 20 can overhang the lower semiconductor chip 10. The third portion of the upper semiconductor chip 20, which can overhang the lower semiconductor chip 10, can be partially attached to the top surface of the package substrate 100.

In an embodiment, the lower bonding wires 310 of the semiconductor package 1, which electrically connect the lower semiconductor chip 10 to the package substrate 100, can be connected to the lower bonding pads PAD1, which can be disposed at the same vertical level as the terminal pads OPAD which have the external connection terminals 500 attached thereto. Accordingly, a signal transmission length between the lower semiconductor chip 10 and each of the external connection terminals 500 can be decreased.

Therefore, the thickness and volume of the semiconductor package 1 can be reduced. Warpage of the upper semiconductor chip 20 stacked on the lower semiconductor chip 10 can be reduced such that the semiconductor package 1 can have structural reliability. Because the signal transmission length between the lower semiconductor chip 10 and each of the external connection terminals 500 can be decreased, high-speed operation can be possible.

Figure 2A:
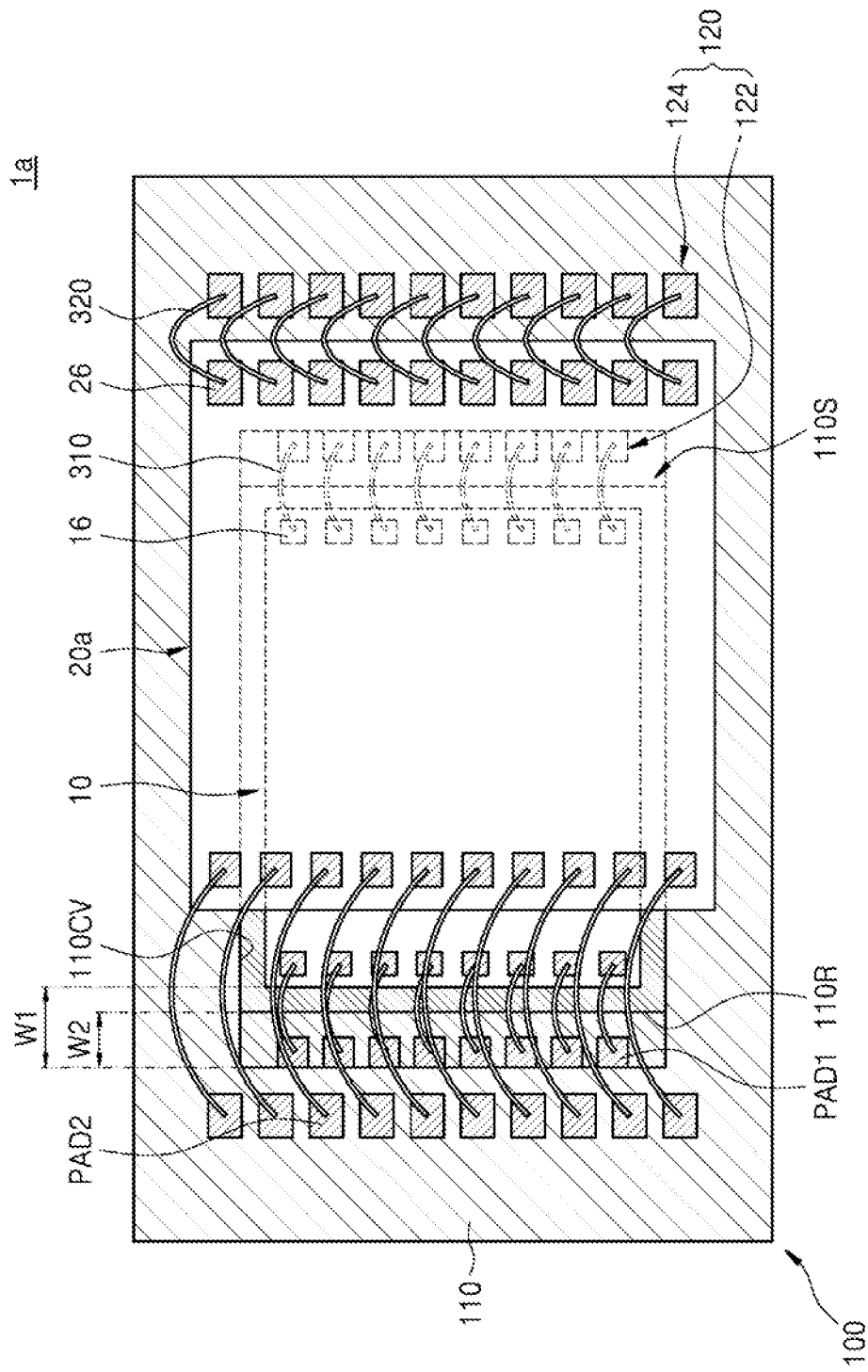
FIGS. 2A and 2B are plan views of semiconductor packages according to an embodiment of the inventive concept.
Figure 2B:
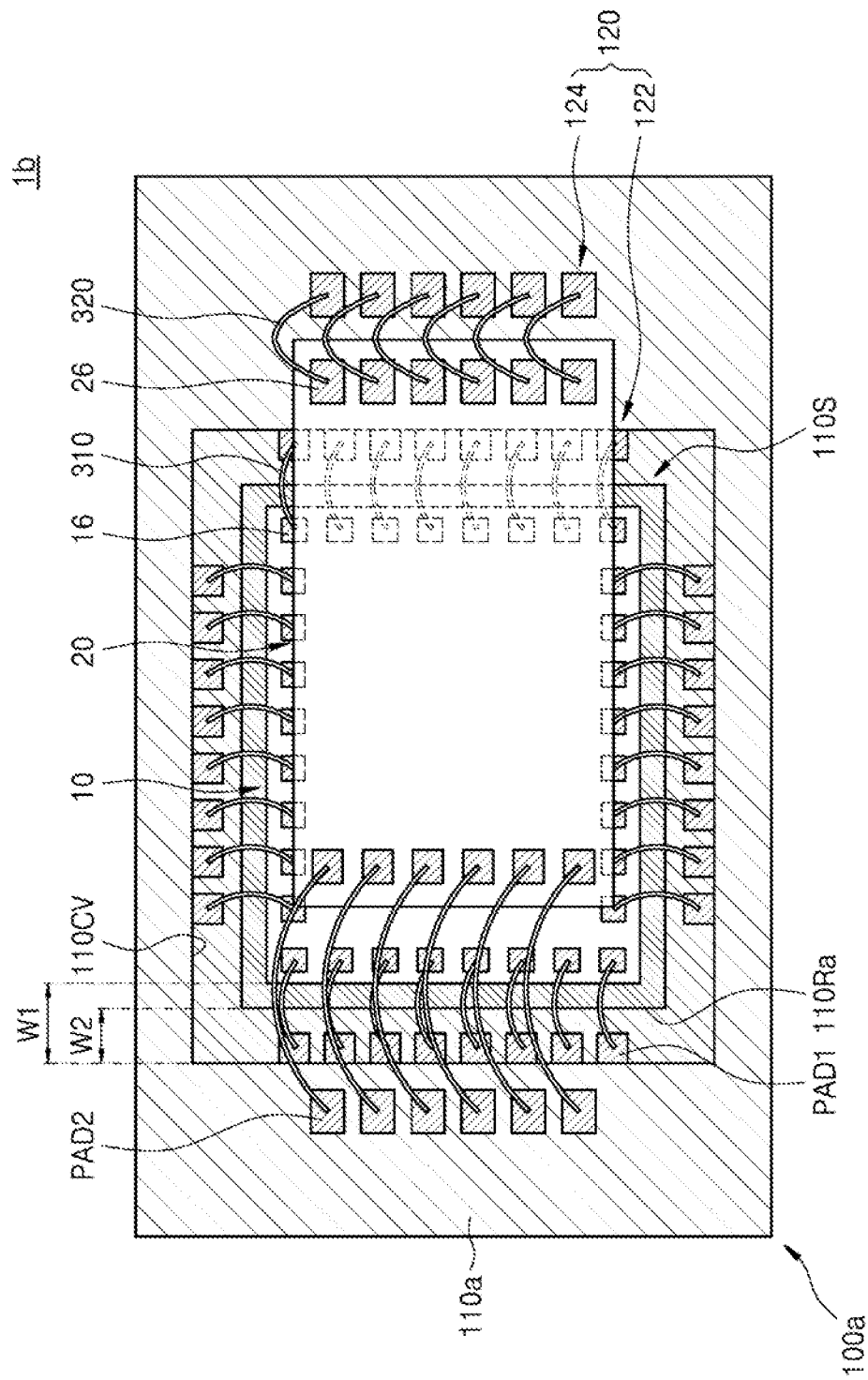

FIGS. 2A and 2B are plan views of semiconductor packages 1a and 1b according to an embodiment of the inventive concept. In FIGS. 1A through 2B, like reference numerals may denote like elements, and redundant descriptions thereof may be omitted.

Referring to FIG. 2A, the semiconductor package 1a can include the package substrate 100, the lower semiconductor chip 10 disposed in the package substrate 100, and an upper semiconductor chip 20a stacked on the package substrate 100 and the lower semiconductor chip 10. The upper semiconductor chip 20a can be attached across the package substrate 100 and the lower semiconductor chip 10. The upper semiconductor chip 20a can be attached across the top surface of the substrate base 110 of the package substrate 100 and the top surface of the lower semiconductor chip 10.

The package substrate 100 can include the substrate base 110, a plurality of wiring patterns 120, and a plurality of conductive vias 130. The substrate base 110 can include the chip-accommodating cavity 110CV and at least one bonding recess 110R which can contact the chip-accommodating cavity 110CV. The wiring patterns 120 can include a plurality of bottom wiring patterns 122 on the bottom surface of the substrate base 110 and a plurality of top wiring patterns 124 on the top surface of the substrate base 110. The bottom wiring patterns 122 can include a plurality of terminal pads OPAD shown in FIG. 1A and a plurality of lower bonding pads PAD1. The top wiring patterns 124 can include a plurality of upper bonding pads PAD2. A plurality of external connection terminals 500 shown in FIG. 1A can be respectively attached to the terminal pads OPAD. A plurality of lower bonding wires 310 can be respectively connected between a plurality of first chip pads 16 of the lower semiconductor chip 10 and the lower bonding pads PAD1. A plurality of upper bonding wires 320 can be respectively connected between a plurality of second chip pads 26 of the upper semiconductor chip 20a and the upper bonding pads PAD2.

The upper semiconductor chip 20a can have a rectangular shape. Three edges among the four edges of the upper semiconductor chip 20a can entirely overlap the top surface of the substrate base 110 in the vertical direction, and the fourth edge of the upper semiconductor chip 20a can partially overlap the lower semiconductor chip 10 in the vertical direction. A first portion of the fourth edge of the upper semiconductor chip 20a can overlap the top surface of the substrate base 110 in the vertical direction, a second portion of the fourth edge of the upper semiconductor chip 20a can overlap the lower semiconductor chip 10, and a third portion of the fourth edge of the upper semiconductor chip 20a can overhang a portion of the chip-accommodating cavity 110CV in which the lower semiconductor chip 10 can be omitted.

Referring to FIG. 2B, the semiconductor package 1b can include a package substrate 100a, the lower semiconductor chip 10 disposed in the package substrate 100a, and the upper semiconductor chip 20 stacked on the package substrate 100a and the lower semiconductor chip 10. The upper semiconductor chip 20 can be attached across the package substrate 100a and the lower semiconductor chip 10. The upper semiconductor chip 20 can be attached across the top surface of the substrate base 110a of the package substrate 100a and the top surface of the lower semiconductor chip 10.

The package substrate 100a can include the substrate base 110a, a plurality of wiring patterns 120, and a plurality of conductive vias 130. The substrate base 110a can include the chip-accommodating cavity 110CV and at least one bonding recess 110Ra which may contact the chip-accommodating cavity 110CV. The wiring patterns 120 can include a plurality of bottom wiring patterns 122 on the bottom surface of the substrate base 110a and a plurality of top wiring patterns 124 on the top surface of the substrate base 110a. The bottom wiring patterns 122 can include a plurality of terminal pads OPAD show in FIG. 1A and a plurality of lower bonding pads PAD1. The top wiring patterns 124 can include a plurality of upper bonding pads PAD2. A plurality of external connection terminals 500 shown in FIG. 1A can be respectively attached to the terminal pads OPAD. A plurality of lower bonding wires 310 can be respectively connected between a plurality of first chip pads 16 of the lower semiconductor chip 10 and the lower bonding pads PAD1. A plurality of upper bonding wires 320 can be respectively connected between a plurality of second chip pads 26 of the upper semiconductor chip 20 and the upper bonding pads PAD2.

In some embodiments, a plurality of first chip pads 16 can be arranged in a portion of the top surface of the lower semiconductor chip 10 which can be adjacent to each of the four edges of the top surface of the lower semiconductor chip 10. For example, a plurality of first chip pads 16 can be arranged along the four edges of the top surface of the lower semiconductor chip 10 and can be spaced from one another.

The bonding recess 110Ra can have a bar shape or a ring shape which can extend along side walls of the chip-accommodating cavity 110CV. In some embodiments, the substrate base 110a can have a bonding recess 110Ra which can extend along a side wall of the chip-accommodating cavity 110CV and at least partially surround the chip support 110S. However, embodiments of the inventive concept are not limited thereto. For example, the substrate base 110a may include four bonding recesses 110Ra which may contact the chip-accommodating cavity 110CV. For example, bonding recess 110Ra, may have a bar shape and may be respectively adjacent to the four edges of the chip-accommodating cavity 110CV and spaced apart from one another.

The lower bonding wires 310 can be connected between the first chip pads 16, which are adjacent to the four edges of the top surface of the lower semiconductor chip 10, and the lower bonding pads PAD1, which can be exposed in the bottom of the bonding recess 110Ra adjacent to the four edges of the top surface of the lower semiconductor chip 10. In other words, each of the lower bonding wires 310 can connect a corresponding first chip pad 16 to a corresponding lower bonding pad PAD1 across one of the four edges of the top surface of the lower semiconductor chip 10.

Figure 3A:
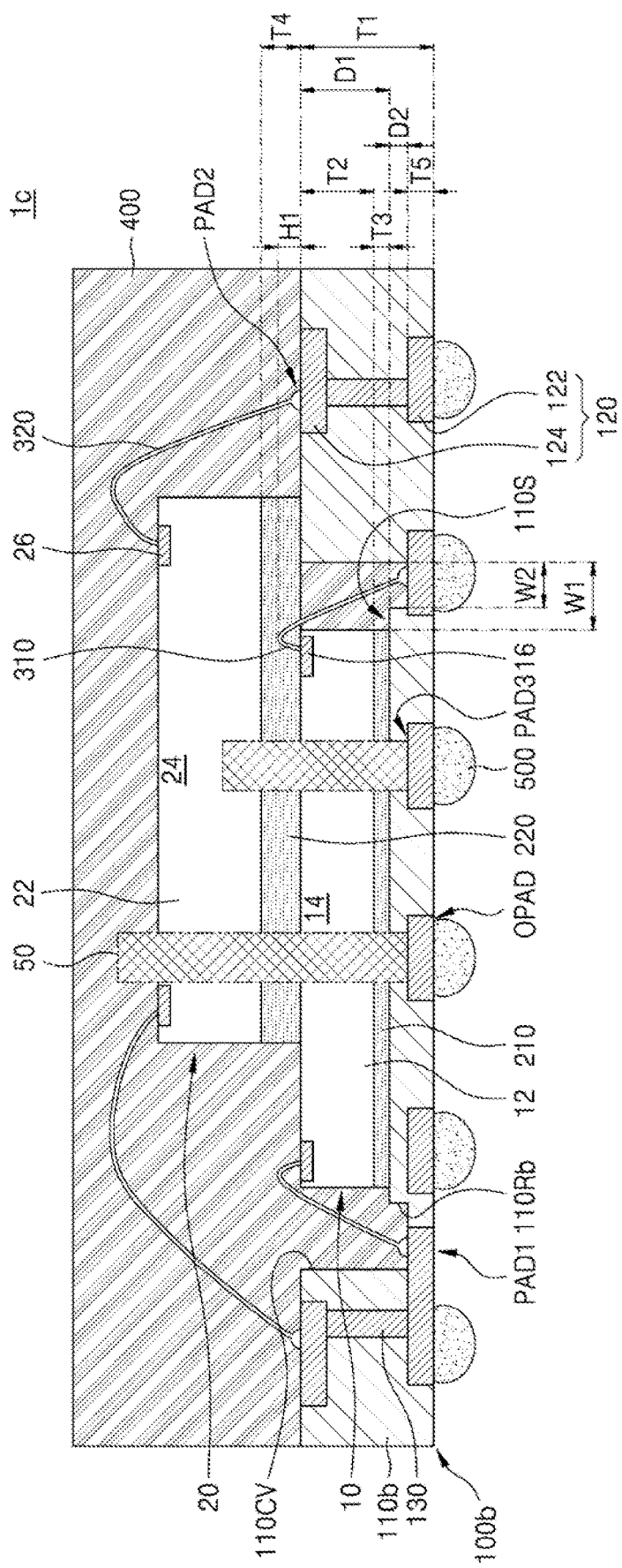
FIGS. 3A and 3B are respectively a cross-sectional view and a plan view of a semiconductor package according to an embodiment of the inventive concept.
Figure 3B:
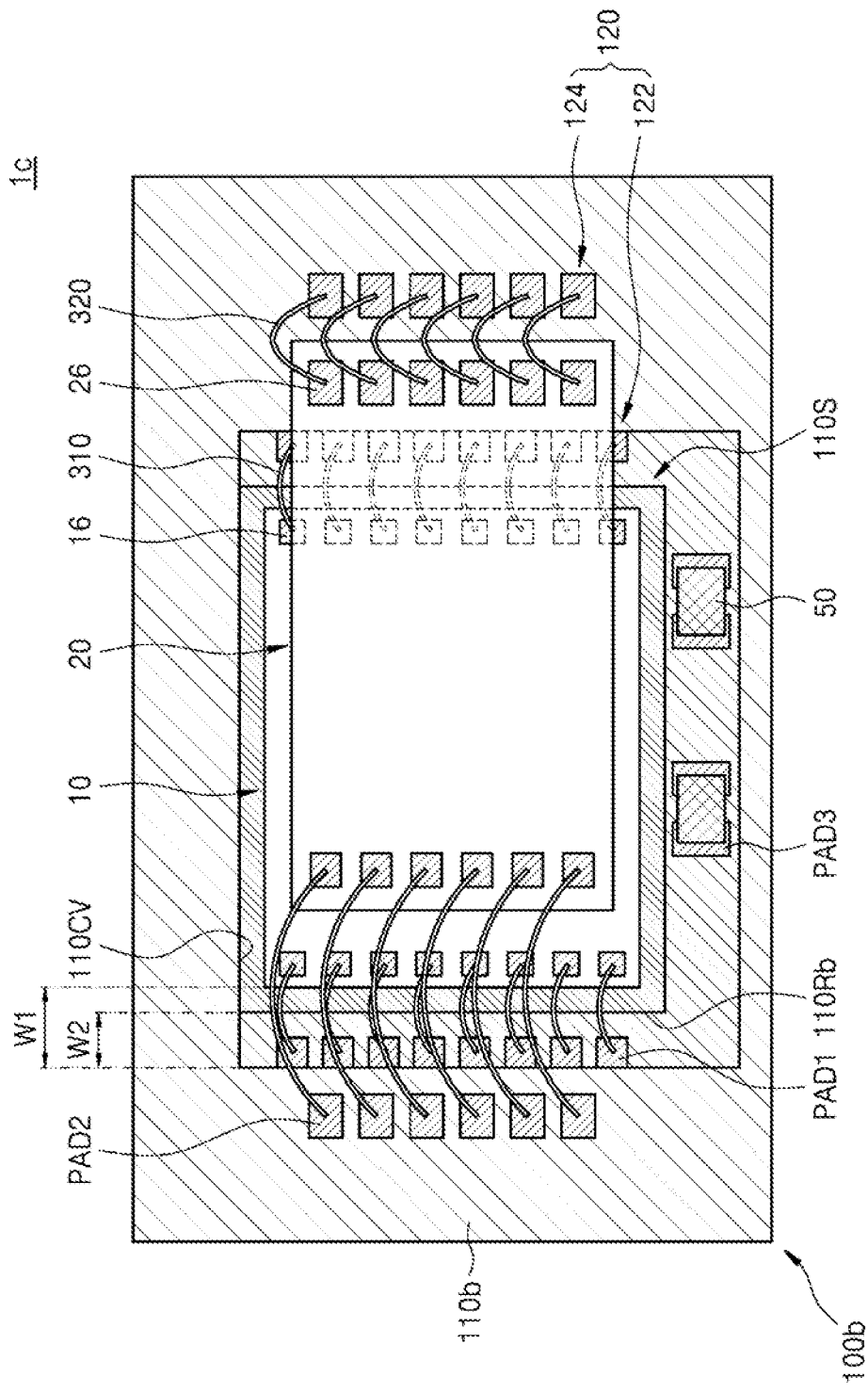

FIGS. 3A and 3B are respectively a cross-sectional view and a plan view of a semiconductor package 1c according to an embodiment of the inventive concept. In FIGS. 1A and 1B and FIGS. 3A and 3B, like reference numerals denote like elements, and redundant descriptions thereof may be omitted.

Referring to FIGS. 3A and 3B, the semiconductor package 1c can include a package substrate 100b, the lower semiconductor chip 10 disposed in the package substrate 100b, and the upper semiconductor chip 20 stacked on the package substrate 100b and the lower semiconductor chip 10. The upper semiconductor chip 20 can be attached across the package substrate 100b and the lower semiconductor chip 10. The upper semiconductor chip 20 can be attached across the top surface of a substrate base 110b of the package substrate 100b and the top surface of the lower semiconductor chip 10.

The package substrate 100b can include the substrate base 110b, a plurality of wiring patterns 120, and a plurality of conductive vias 130. The substrate base 110b can include the chip-accommodating cavity 110CV and a bonding recess 110Rb which can contact the chip-accommodating cavity 110CV. The wiring patterns 120 can include a plurality of bottom wiring patterns 122 on the bottom surface of the substrate base 110b and a plurality of top wiring patterns 124 on the top surface of the substrate base 110b. The bottom wiring patterns 122 can include a plurality of terminal pads OPAD and a plurality of lower bonding pads PAD1. The top wiring patterns 124 can include a plurality of upper bonding pads PAD2. A plurality of external connection terminals 500 can be respectively attached to the terminal pads OPAD. A plurality of lower bonding wires 310 can be respectively connected between a plurality of first chip pads 16 of the lower semiconductor chip 10 and the lower bonding pads PAD1. A plurality of upper bonding wires 320 can be respectively connected between a plurality of second chip pads 26 of the upper semiconductor chip 20 and the upper bonding pads PAD2.

The substrate base 110b can have one bonding recess 110Rb, which can extend along a side wall of the chip-accommodating cavity 110CV and at least partially surround a portion of the chip support 110S. In some embodiments, the substrate base 110b can include three bonding recess 110Rb which can contact the chip-accommodating cavity 110CV. For example, the three bonding recess 110Rb may each have a bar shape and may be respectively adjacent to three edges of the chip-accommodating cavity 110CV and spaced apart from one another.

The bottom wiring patterns 122 can include the terminal pads OPAD, the lower bonding pads PAD1, and at least two passive element pads PAD3. The lower bonding pads PAD1 and the passive element pads PAD3 can be at least partially exposed in the bottom of the bonding recess 110Rb.

At least one passive element 50 can be attached to a passive element pad PAD3. The passive element pads PAD3 and the at least one passive element 50 can be spaced apart from each other in the bonding recess 110Rb and the chip-accommodating cavity 110CV.

In some embodiments, the top surface of the passive element 50 can be at a higher vertical level than the top surface of the upper semiconductor chip 20 and may thus protrude above the top surface of the upper semiconductor chip 20.

In some embodiments, the semiconductor package 1c can include a plurality of passive elements 50. The top surface of at least one of the passive elements 50 can beat a higher vertical level than the top surface of the upper semiconductor chip 20. The top surface of at least one of the passive elements 50 can be at a vertical level that is lower than or equal to the top surface of the upper semiconductor chip 20.

Figure 4:
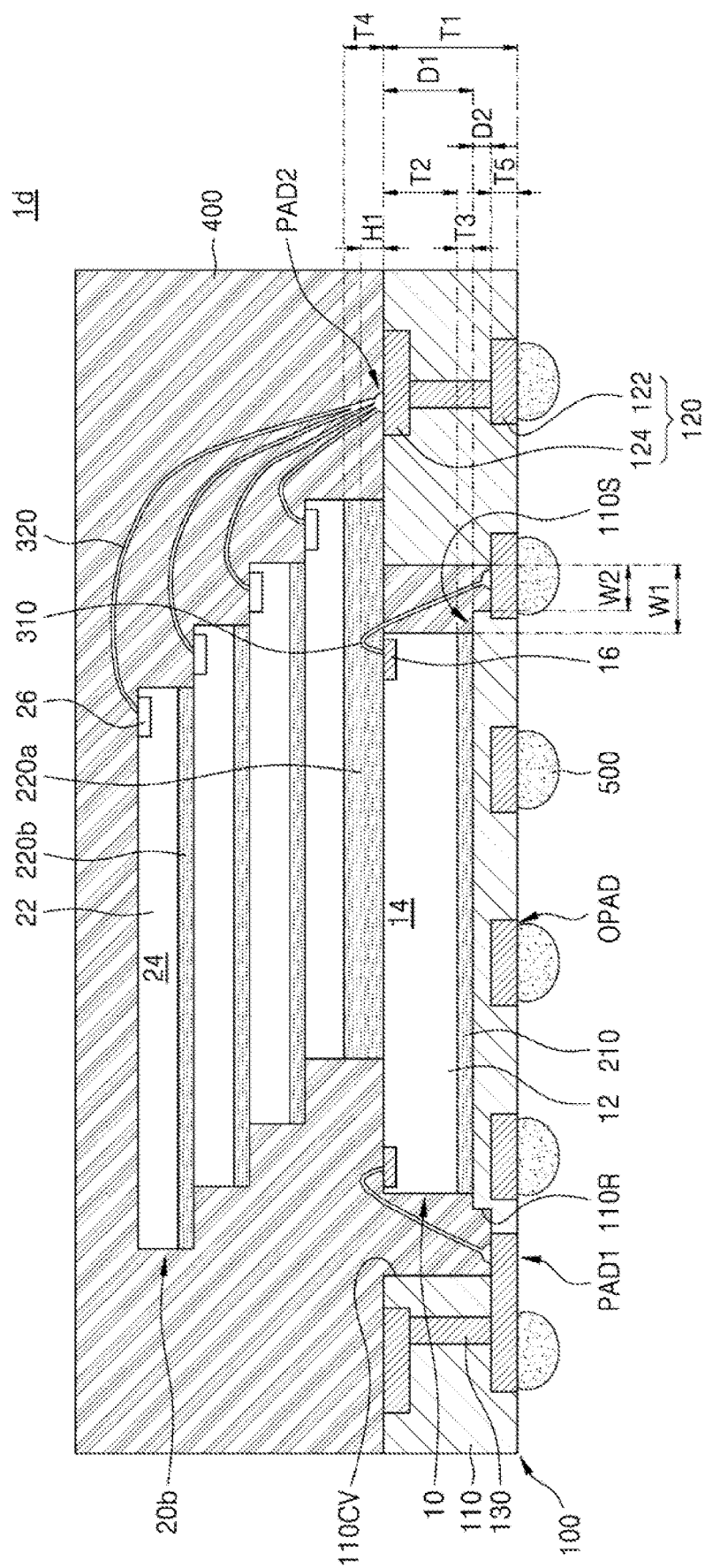
FIG. 4 is a cross-sectional view of a semiconductor package according to an embodiment of the inventive concept.

FIG. 4 is a cross-sectional view of a semiconductor package 1d according to an embodiment of the inventive concept. In FIGS. 1A and 1B and FIG. 4, like reference numerals denote like elements, and redundant descriptions thereof may be omitted.

Referring to FIG. 4, the semiconductor package 1d can include the package substrate 100, the lower semiconductor chip 10 disposed in the package substrate 100, and a plurality of upper semiconductor chips 20b stacked on the package substrate 100 and the lower semiconductor chip 10. The upper semiconductor chips 20b can be sequentially stacked on each other in a stair shape. In other words, the upper semiconductor chips 20b can be shifted by a certain distance from each other in the horizontal direction and sequentially stacked in the vertical direction.

The package substrate 100 can include the substrate base 110, a plurality of wiring patterns 120, and a plurality of conductive vias 130. The substrate base 110 can include the chip-accommodating cavity 110CV and at least one bonding recess 110R which can contact the chip-accommodating cavity 110CV. The wiring patterns 120 can include a plurality of bottom wiring patterns 122 on the bottom surface of the substrate base 110 and a plurality of top wiring patterns 124 on the top surface of the substrate base 110. The bottom wiring patterns 122 can include a plurality of terminal pads OPAD and a plurality of lower bonding pads PAD1. The top wiring patterns 124 can include a plurality of upper bonding pads PAD2. A plurality of external connection terminals 500 can be respectively attached to the terminal pads OPAD. A plurality of lower bonding wires 310 can be respectively connected between a plurality of first chip pads 16 of the lower semiconductor chip 10 and the lower bonding pads PAD1. A plurality of upper bonding wires 320 can be respectively connected between a plurality of second chip pads 26 of an upper semiconductor chip 20b and the upper bonding pads PAD2. In some embodiments, a plurality of upper bonding wires 320 respectively connected to a plurality of upper semiconductor chips 20b can be connected to an upper bonding pad PAD2. In other words, a number of upper bonding wires 320 equal to a number of the upper semiconductor chips 20b can be connected in common to one upper bonding pad PAD2.

A bottommost upper semiconductor chip 20b can be attached across the package substrate 100 and the lower semiconductor chip 10. The bottommost upper semiconductor chip 20b can be attached across the top surface of each of the package substrate 100 and the lower semiconductor chip 10 by a first upper die adhesive film 220a which can be disposed therebetween. Each upper semiconductor chips 20b can be attached to an upper semiconductor chip 20b which can be disposed therebelow by a second upper die adhesive film 220b which can be disposed therebetween. The first upper die adhesive film 220a can have substantially the same thickness as the upper die adhesive film 220, and the second upper die adhesive film 220b can have substantially the same thickness as the lower die adhesive film 210. For example, the first upper die adhesive film 220a can have the fourth thickness T4, and the second upper die adhesive film 220b can have the third thickness T3.

Figure 5A:
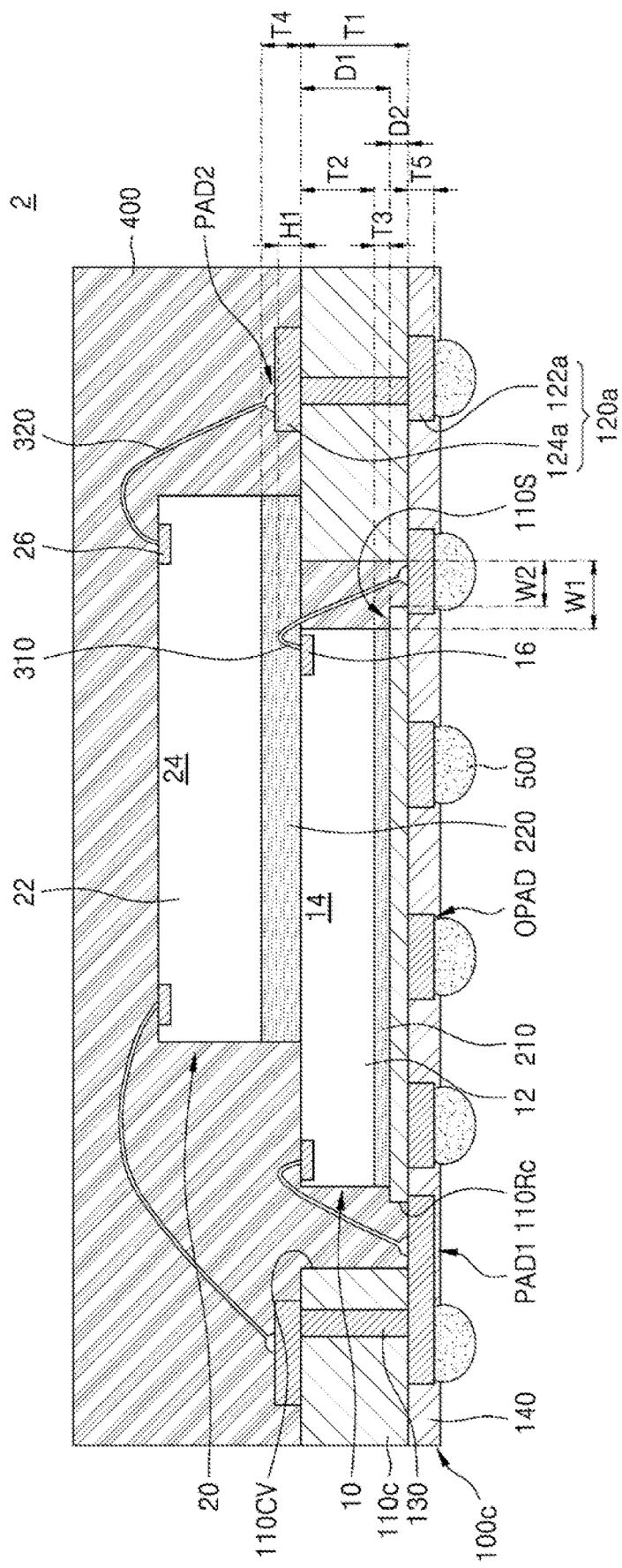
FIGS. 5A and 5B are respectively a cross-sectional view and a plan view of a semiconductor package according to an embodiment of the inventive concept.
Figure 5B:
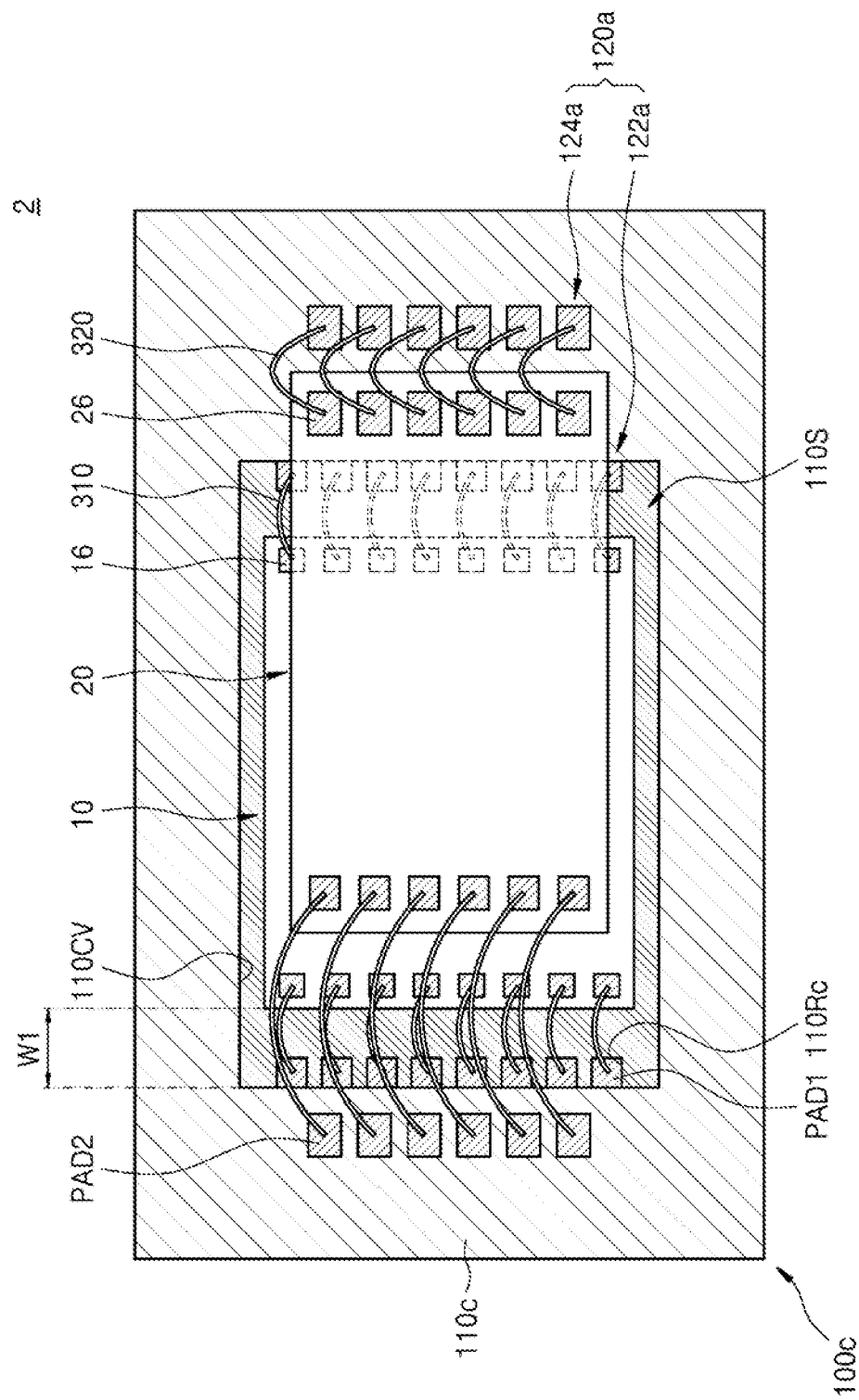

FIGS. 5A and 5B are respectively a cross-sectional view and a plan view of a semiconductor package 2 according to an embodiment of the inventive concept. In FIGS. 1A and 1B and FIGS. 5A and 5B, like reference numerals may denote like elements, and redundant descriptions thereof may be omitted.

Referring to FIGS. 5A and 5B, the semiconductor package 2 can include a package substrate 100c, the lower semiconductor chip 10 disposed in the package substrate 100c, and the upper semiconductor chip 20 stacked on the package substrate 100c and the lower semiconductor chip 10. The upper semiconductor chip 20 can be attached across the package substrate 100c and the lower semiconductor chip 10. The upper semiconductor chip 20 can be attached across the top surface of a substrate base 110c of the package substrate 100c and the top surface of the lower semiconductor chip 10.

The package substrate 100c can include the substrate base 110c, a plurality of wiring patterns 120a, and a plurality of conductive vias 130. The wiring patterns 120a can include a plurality of bottom wiring patterns 122a on the bottom surface of the substrate base 110c and a plurality of top wiring patterns 124a on the top surface of the substrate base 110c. The bottom wiring patterns 122a and the top wiring patterns 124a might not be covered by the substrate base 110c. The bottom wiring patterns 122a can protrude downward from the bottom surface of the substrate base 110c, and the top wiring patterns 124a can protrude upwards from the top surface of the substrate base 110c.

A solder resist layer 140 can be formed on the bottom surface of the substrate base 110c. The solder resist layer 140 on the bottom surface of the substrate base 110c can expose a plurality of terminal pads OPAD. The solder resist layer 140 can cover the bottom wiring patterns 122a and can expose the terminal pads OPAD. In some embodiments, the solder resist layer 140 can also be disposed on the top surface of the substrate base 110c such that the solder resist layer 140 can expose a plurality of upper bonding pads PAD2, cover the top wiring patterns 124a, and expose the upper bonding pads PAD2.

In some embodiments, the solder resist layer 140 can be formed by applying solder mask insulating ink to the top and bottom surface of the substrate base 110c via screen printing or inkjet printing and hardening the solder mask insulating ink via ultraviolet (UV) or infrared (IR) light. In some embodiments, the solder resist layer 140 can be formed by applying photo-imagable solder resist to the top and bottom surfaces of the substrate base 110c via screen printing, spray coating, or applying a film-type solder resist material to the top and bottom surfaces of the substrate base 110c via a laminating method, by removing an unnecessary portion via exposure and development, and by hardening via heat, UV light, or IR light.

The substrate base 110c can include the chip-accommodating cavity 110CV and a plurality of bonding recesses 110Rc which can contact the chip-accommodating cavity 110CV. The bonding recesses 110Rc can extend from the bottom of the chip-accommodating cavity 110CV to the bottom surface of the substrate base 110c. For example, the bottom of each of the bonding recesses 110Rc be at the same vertical level as the bottom surface of the substrate base 110c. The solder resist layer 140 can be covered in the bottom of each of the bonding recesses 110Rc. The lower bonding pads PAD1, which can correspond to some of the bottom wiring patterns 122a, can be exposed in the bottoms of the bonding recesses 110Rc. The number of bonding recesses 110Rc can be the same as the number of lower bonding pads PAD1.

Each of the bonding recesses 110Rc can have a shape which corresponds to a shape of a corresponding lower bonding pad PAD1. The bonding recesses 110Rc can provide the lower bonding pads PAD1. For example, each of the bonding recesses 110Rc may have a rectangular shape.

Figure 6A:
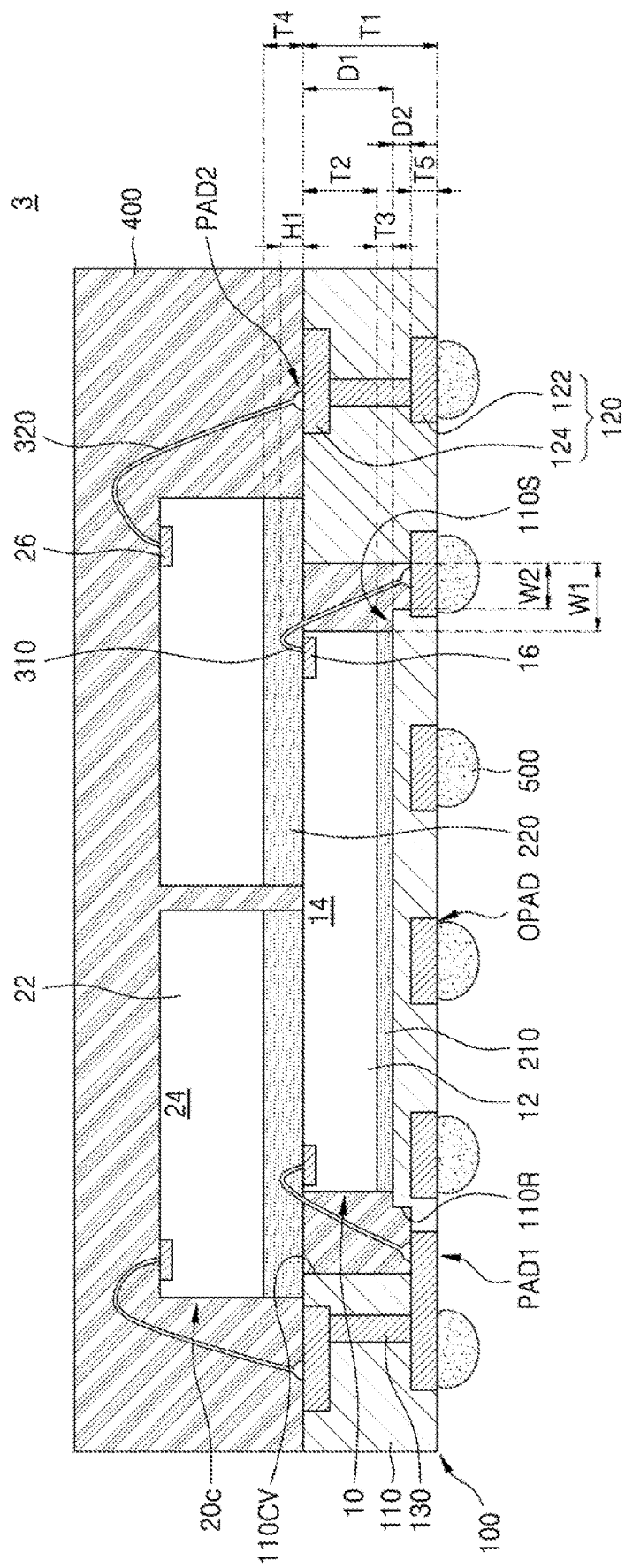
FIGS. 6A and 6B are respectively a cross-sectional view and a plan view of a semiconductor package according to an embodiment of the inventive concept.
Figure 6B:
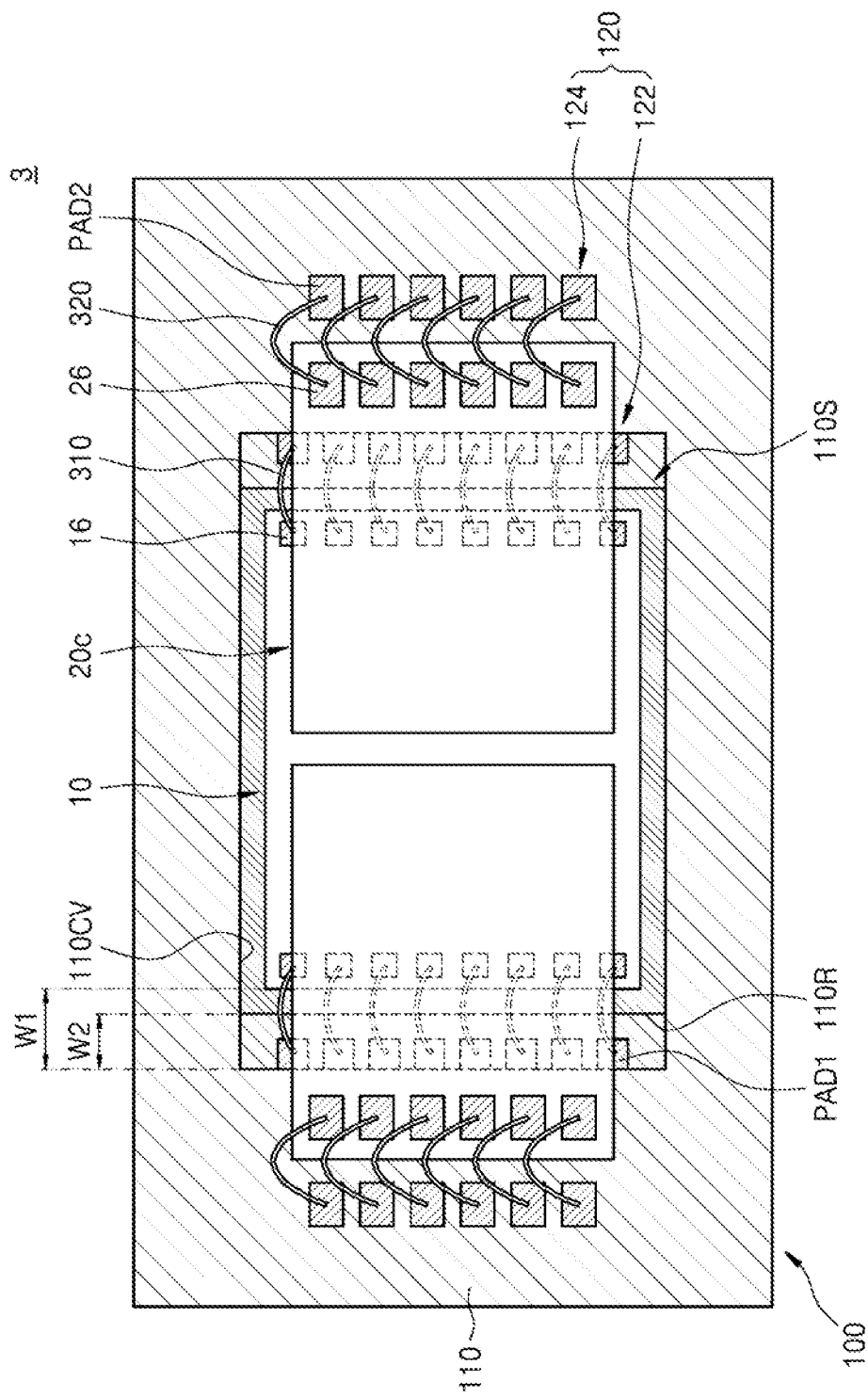

FIGS. 6A and 6B are respectively a cross-sectional view and a plan view of a semiconductor package 3 according to an embodiment of the inventive concept. In FIGS. 1A and 1B and FIGS. 6A and 6B, like reference numerals may denote like elements, and redundant descriptions thereof may be omitted.

Referring to FIGS. 6A and 6B, the semiconductor package 3 can include the package substrate 100, the lower semiconductor chip 10 disposed in the package substrate 100, and at least two upper semiconductor chips 20c stacked on the package substrate 100 and the lower semiconductor chip 10. The package substrate 100 can include the substrate base 110, a plurality of wiring patterns 120, and a plurality of conductive vias 130. The substrate base 110 can include the chip-accommodating cavity 110CV and at least one bonding recess 110R which can contact the chip-accommodating cavity 110CV. The wiring patterns 120 can include a plurality of bottom wiring patterns 122 on the bottom surface of the substrate base 110 and a plurality of top wiring patterns 124 on the top surface of the substrate base 110. The bottom wiring patterns 122 can include a plurality of terminal pads OPAD and a plurality of lower bonding pads PAD1. The top wiring patterns 124 can include a plurality of upper bonding pads PAD2. A plurality of external connection terminals 500 can be respectively attached to the terminal pads OPAD. A plurality of lower bonding wires 310 can be respectively connected between a plurality of first chip pads 16 of the lower semiconductor chip 10 and the lower bonding pads PAD1. A plurality of upper bonding wires 320 can be respectively connected between a plurality of second chip pads 26 of the upper semiconductor chips 20c and the upper bonding pads PAD2.

Each of the upper semiconductor chips 20c can be attached across the package substrate 100 and the lower semiconductor chip 10 by an upper die adhesive film 220 disposed between each upper semiconductor chip 20c and each of the package substrate 100 and the lower semiconductor chip 10. The upper semiconductor chips 20c can be attached across the top surface of the substrate base 110 of the package substrate 100 and the top surface of the lower semiconductor chip 10 and can be spaced apart from each other. For example, the upper semiconductor chips 20c may be respectively attached to portions of the top surface of the lower semiconductor chip 10 which can be respectively adjacent to different edges of the four edges of the top surface of the lower semiconductor chip 10, and may be respectively attached to portions of the top surface of the substrate base 110 which can be respectively adjacent to the portions of the top surface of the lower semiconductor chip 10. In some embodiments, some of the upper bonding wires 320 can be respectively connected between some of the upper bonding pads PAD2 and a plurality of second chip pads 26 of a first upper semiconductor chip 20c, and some of the upper bonding wires 320 can be respectively connected between some of the upper bonding pads PAD2 and a plurality of second chip pads 26 of a second upper semiconductor chip 20c.

In an embodiment, similar to the upper semiconductor chip 20a of FIG. 2A, three edges among the four edges of each of the upper semiconductor chips 20c can entirely overlap the top surface of the substrate base 110 in the vertical direction, and the fourth edge of each of the upper semiconductor chips 20c can partially overlap the lower semiconductor chip 10 in the vertical direction. In an embodiment, similarly to the upper semiconductor chip 20b of FIG. 4, the semiconductor package 3 can include a plurality of upper semiconductor chips 20c which can be sequentially stacked on each other in a stair shape.

Figure 7B:
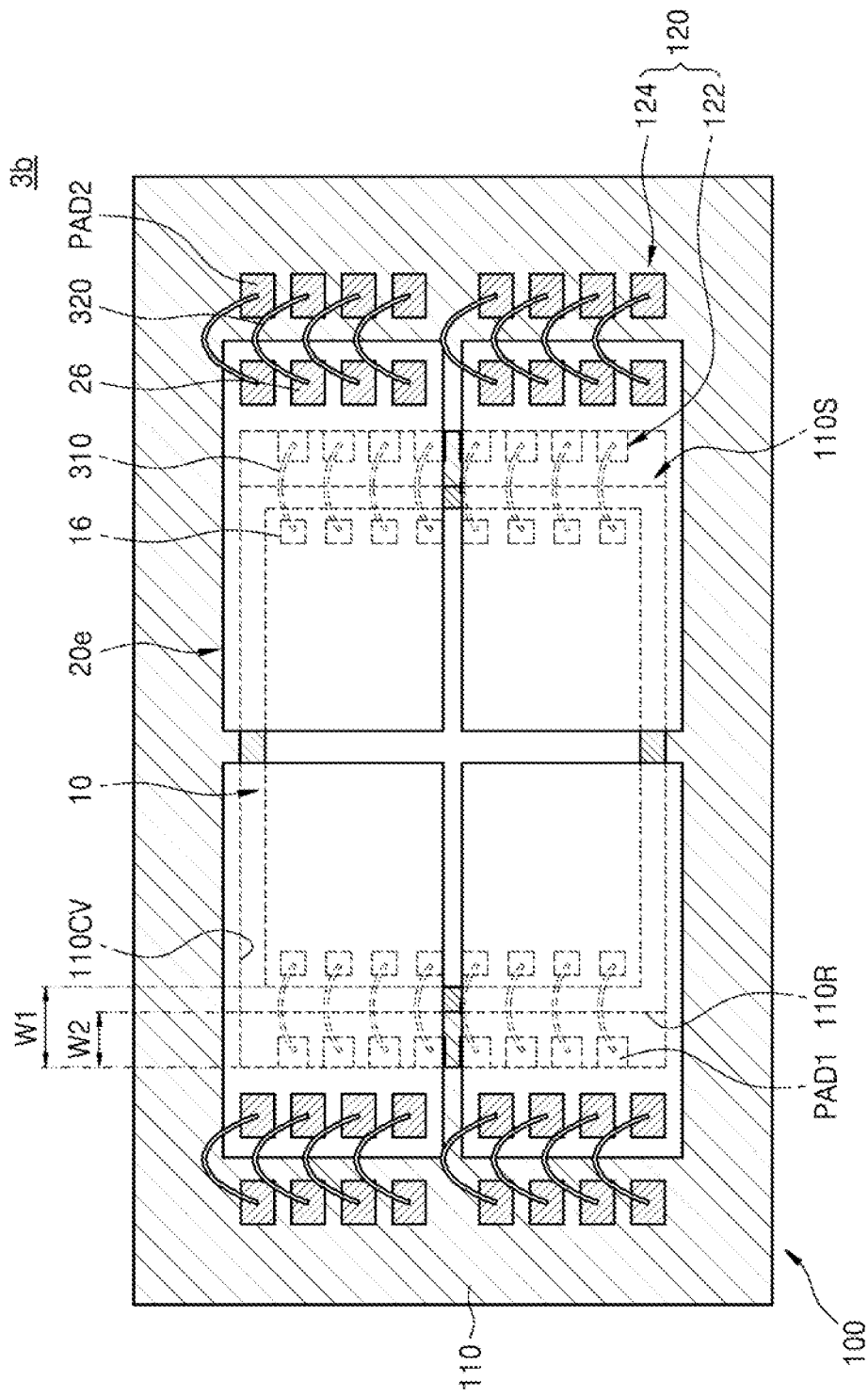

FIGS. 7A and 7B are plan views of semiconductor packages 3a and 3b according to embodiments of the inventive concept. In FIGS. 1A through 7B, like reference numerals may denote like elements, and redundant descriptions thereof may be omitted.

Referring to FIG. 7A, the semiconductor package 3a can include the package substrate 100, the lower semiconductor chip 10 disposed in the package substrate 100, and at least four upper semiconductor chips 20d stacked on the package substrate 100 and the lower semiconductor chip 10.

The package substrate 100 can include the substrate base 110, a plurality of wiring patterns 120, and a plurality of conductive vias 130. The substrate base 110 can include the chip-accommodating cavity 110CV and at least one bonding recess 110R, which can contact the chip-accommodating cavity 110CV. The wiring patterns 120 can include a plurality of bottom wiring patterns 122 on the bottom surface of the substrate base 110 and a plurality of top wiring patterns 124 on the top surface of the substrate base 110. The bottom wiring patterns 122 can include a plurality of terminal pads OPAD shown in FIG. 1A and a plurality of lower bonding pads PAD1. The top wiring patterns 124 can include a plurality of upper bonding pads PAD2. A plurality of external connection terminals 500 shown in FIG. 1A can be respectively attached to the terminal pads OPAD. A plurality of lower bonding wires 310 can be respectively connected between a plurality of first chip pads 16 of the lower semiconductor chip 10 and the lower bonding pads PAD1. A plurality of upper bonding wires 320 can be respectively connected between a plurality of second chip pads 26 of the upper semiconductor chips 20d and the upper bonding pads PAD2. In some embodiments, some of the upper bonding wires 320 can be respectively connected between a plurality of second chip pads 26 of each of the upper semiconductor chips 20d and corresponding upper bonding pads PAD2.

Each of the upper semiconductor chips 20d can be attached across the package substrate 100 and the lower semiconductor chip 10. The upper semiconductor chips 20d can be attached across the top surface of the substrate base 110 of the package substrate 100 and the top surface of the lower semiconductor chip 10 and can be spaced apart from each other. For example, a first group of two upper semiconductor chips 20d and a second group of two upper semiconductor chips 20d may be respectively attached to portions of the top surface of the lower semiconductor chip 10 which can be respectively adjacent to different edges of the four edges of the top surface of the lower semiconductor chip 10, and may be respectively attached to portions of the top surface of the substrate base 110 which can be respectively adjacent to the portions of the top surface of the lower semiconductor chip 10.

Referring to FIG. 7B, the semiconductor package 3b can include the package substrate 100, the lower semiconductor chip 10 disposed in the package substrate 100, and at least four upper semiconductor chips 20e stacked on the package substrate 100 and the lower semiconductor chip 10.

The package substrate 100 can include the substrate base 110, a plurality of wiring patterns 120, and a plurality of conductive vias 130. The substrate base 110 can include the chip-accommodating cavity 110CV and at least one bonding recess 110R which can contact the chip-accommodating cavity 110CV. The wiring patterns 120 can include a plurality of bottom wiring patterns 122 on the bottom surface of the substrate base 110 and a plurality of top wiring patterns 124 on the top surface of the substrate base 110. The bottom wiring patterns 122 can include a plurality of terminal pads OPAD shown in FIG. 1A and a plurality of lower bonding pads PAD1. The top wiring patterns 124 can include a plurality of upper bonding pads PAD2. A plurality of external connection terminals 500 shown in FIG. 1A can be respectively attached to the terminal pads OPAD. A plurality of lower bonding wires 310 can be respectively connected between a plurality of first chip pads 16 of the lower semiconductor chip 10 and the lower bonding pads PAD1. A plurality of upper bonding wires 320 can be respectively connected between a plurality of second chip pads 26 of the upper semiconductor chips 20e and the upper bonding pads PAD2. In some embodiments, some of the upper bonding wires 320 can be respectively connected between a plurality of second chip pads 26 of each of the upper semiconductor chips 20e and corresponding upper bonding pads PAD2.

Each of the upper semiconductor chips 20e can be attached across the package substrate 100 and the lower semiconductor chip 10. The upper semiconductor chips 20e can be attached across the top surface of the substrate base 110 of the package substrate 100 and the top surface of the lower semiconductor chip 10 and can be spaced apart from each other. For example, each of the upper semiconductor chips 20e can be attached to a portion of the top surface of the lower semiconductor chip 10 which can be adjacent to two connected edges among the four edges of the top surface of the lower semiconductor chip 10, and can be attached to a portion of the top surface of the substrate base 110 which can be adjacent to the portion of the top surface of the lower semiconductor chip 10.

Figure 8A:
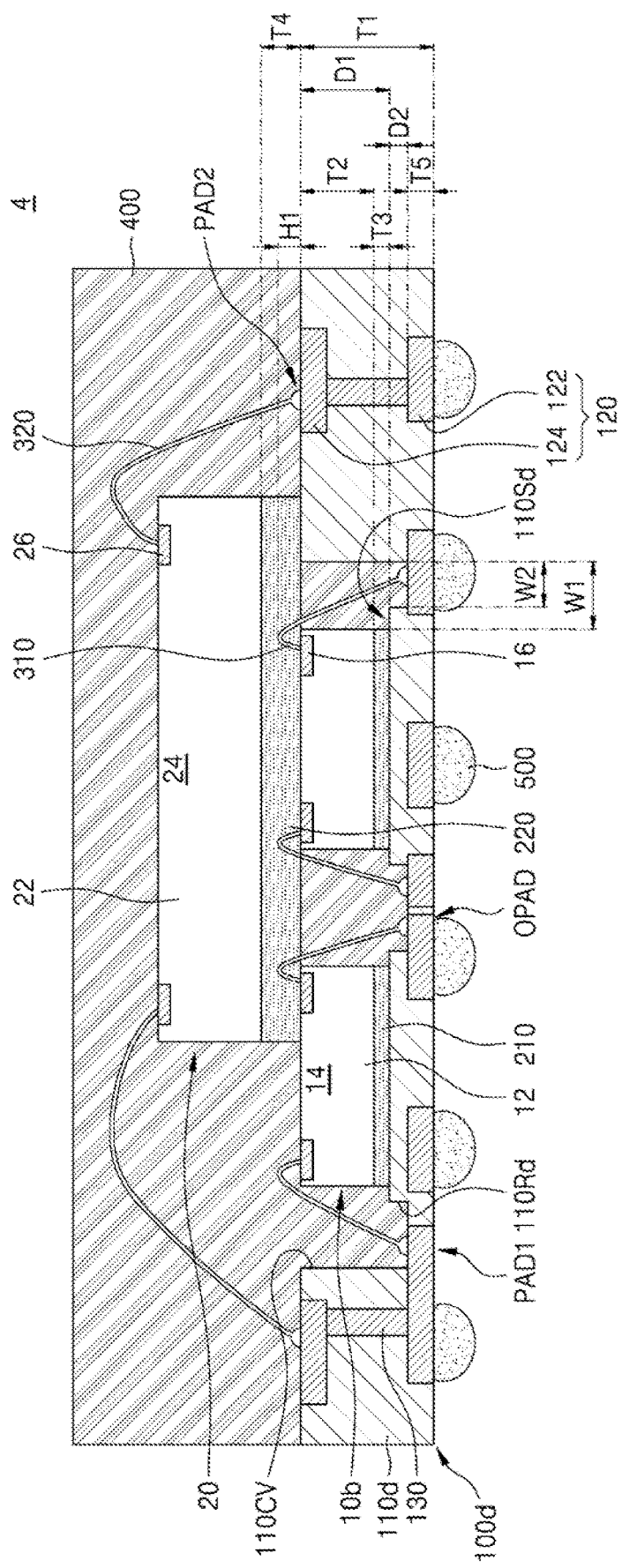
FIGS. 8A and 8B are respectively a cross-sectional view and a plan view of a semiconductor package according to an embodiment of the inventive concept.
Figure 8B:
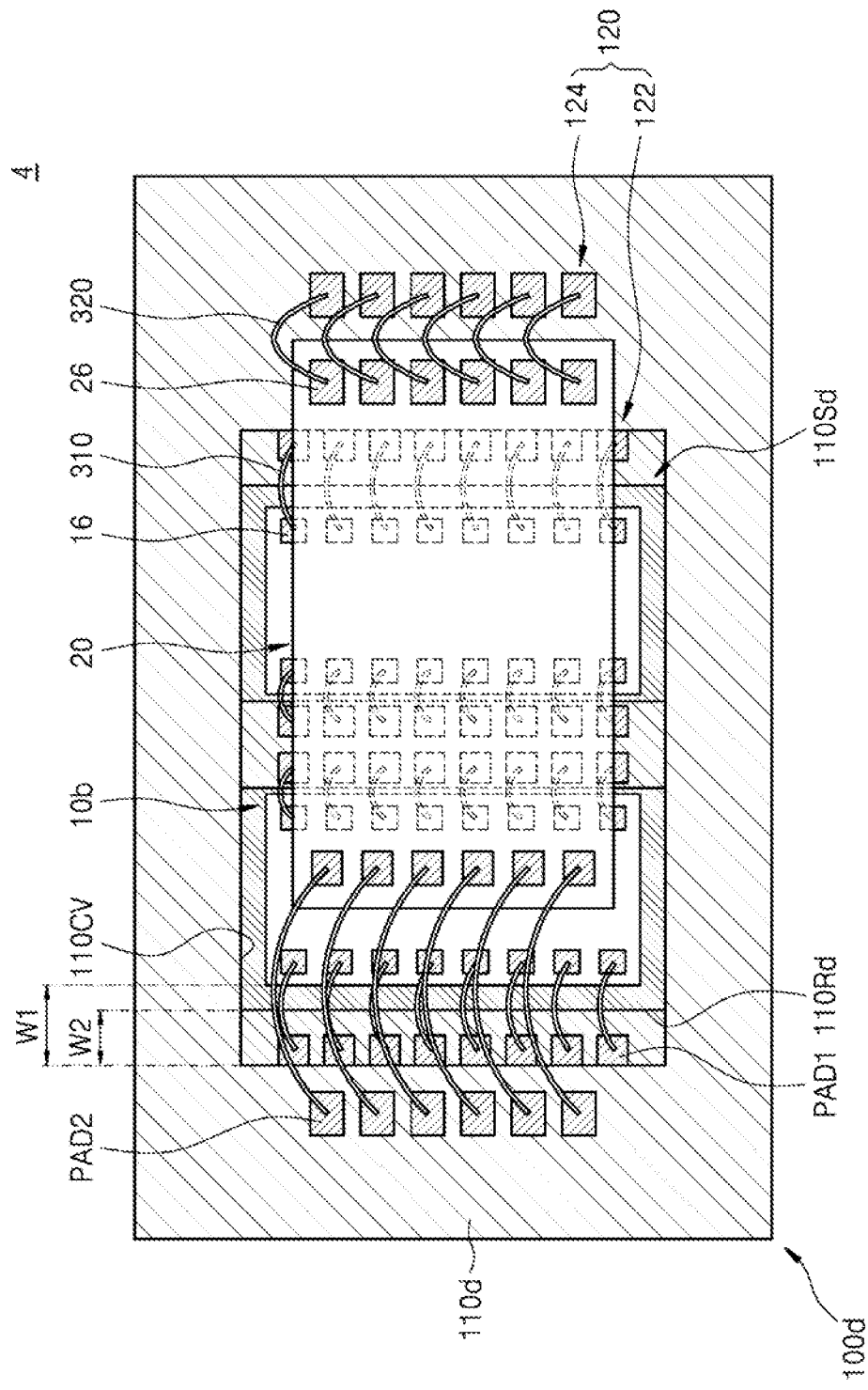

FIGS. 8A and 8B are respectively a cross-sectional view and a plan view of a semiconductor package 4 according to an embodiment of the inventive concept. In FIGS. 1A and 1B and FIGS. 8A and 8B, like reference numerals may denote like elements, and redundant descriptions thereof may be omitted.

Referring to FIGS. 8A and 8B, the semiconductor package 4 can include a package substrate 100d, at least two lower semiconductor chips 10b disposed in the package substrate 100d, and the upper semiconductor chip 20 stacked on the package substrate 100d and the lower semiconductor chips 10b. The upper semiconductor chip 20 can be attached to the package substrate 100d and the lower semiconductor chips 10b.

The package substrate 100d can include a substrate base 110d, a plurality of wiring patterns 120, and a plurality of conductive vias 130. The substrate base 110d can include the chip-accommodating cavity 110CV and at least one bonding recess 110Rd which can contact the chip-accommodating cavity 110CV. The wiring patterns 120 can include a plurality of bottom wiring patterns 122 on the bottom surface of the substrate base 110d and a plurality of top wiring patterns 124 on the top surface of the substrate base 110d. The bottom wiring patterns 122 can include a plurality of terminal pads OPAD and a plurality of lower bonding pads PAD1. The top wiring patterns 124 can include a plurality of upper bonding pads PAD2. A plurality of external connection terminals 500 can be respectively attached to the terminal pads OPAD. A plurality of lower bonding wires 310 can be respectively connected between a plurality of first chip pads 16 of the lower semiconductor chips 10b and the lower bonding pads PAD1. A plurality of upper bonding wires 320 can be respectively connected between a plurality of second chip pads 26 of the upper semiconductor chip 20 and the upper bonding pads PAD2.

In some embodiments, a first group of the lower bonding wires 310 can be respectively connected between some of the lower bonding pads PAD1 and a plurality of first chip pads 16 of a first lower semiconductor chip 10b, and a second group of the lower bonding wires 310 can be respectively connected between some of the lower bonding pads PAD1 and a plurality of first chip pads 16 of a second lower semiconductor chip 10b.

The substrate base 110d can include at least two chip supports 110Sd, which can be defined by the chip-accommodating cavity 110CV and the bonding recess 110Rd. The chip supports 110Sd can each have a rectangular shape and can be spaced apart from each other. Each of the lower semiconductor chips 10b can be attached to a corresponding chip support 110Sd by the lower die adhesive film 210, which can be disposed therebetween.

Although FIGS. 8A and 8B illustrate that the substrate base 110d has three bonding recesses 110Rd, embodiments of the inventive concept are not limited thereto. For example, the substrate base 110d may have one bonding recess 110Rd which may surround the chip supports 110Sd, or at least four bonding recesses 110Rd.

Figure 9A:
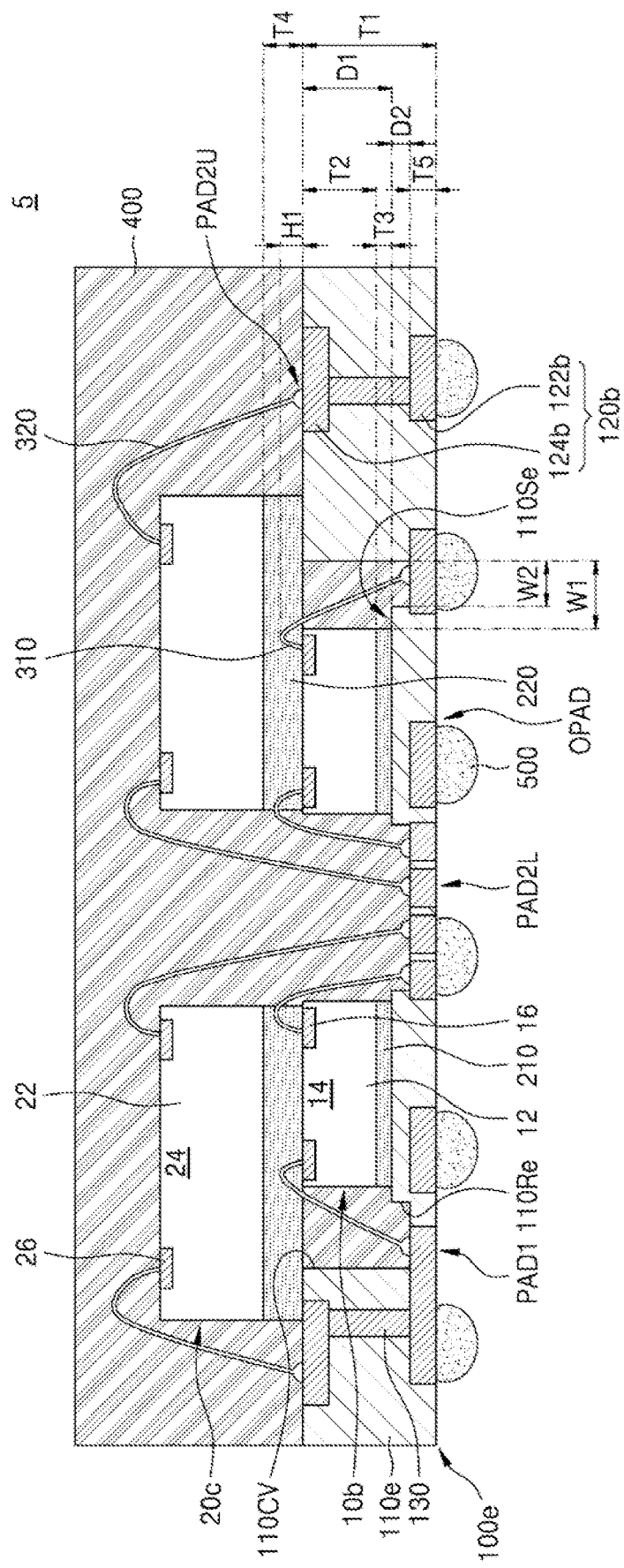
FIGS. 9A and 9B are respectively a cross-sectional view and a plan view of a semiconductor package according to an embodiment of the inventive concept.
Figure 9B:
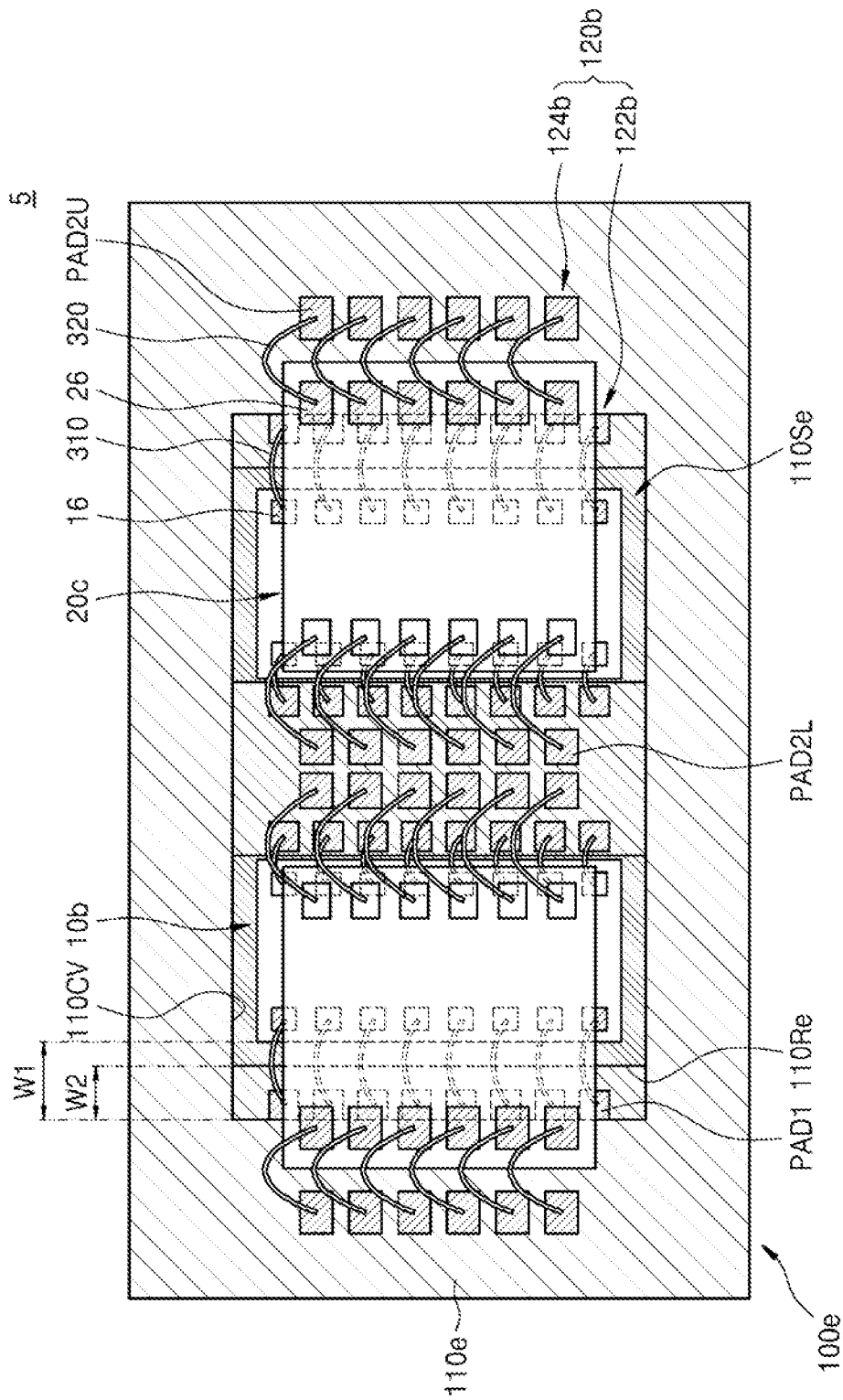

FIGS. 9A and 9B are respectively a cross-sectional view and a plan view of a semiconductor package 5 according to an embodiment of the inventive concept. In FIGS. 1A through 9B, like reference numerals may denote like elements, and redundant descriptions thereof may be omitted.

Referring to FIGS. 9A and 9B, the semiconductor package 5 can include a package substrate 100e, at least two lower semiconductor chips 10b disposed in the package substrate 100e, and at least two upper semiconductor chips 20c stacked on the package substrate 100e and the lower semiconductor chips 10b.

The package substrate 100e can include a substrate base 110e, a plurality of wiring patterns 120b, and a plurality of conductive vias 130. The substrate base 110e can include the chip-accommodating cavity 110CV and at least one bonding recess 110Re which can contact the chip-accommodating cavity 110CV. The substrate base 110e can include at least two chip supports 110Se, which can be defined by the chip-accommodating cavity 110CV and the bonding recess 110Re. The chip supports 110Se can each have a rectangular shape and can be spaced apart from each other.

Each of the lower semiconductor chips 10b can be attached to a corresponding chip support 110Se by the lower die adhesive film 210, which can be disposed therebetween. Each of the upper semiconductor chips 20c can be attached across the package substrate 100e and a corresponding lower semiconductor chip 10b by an upper die adhesive film 220 which can be disposed between each upper semiconductor chip 20c and between each of package substrate 100e and the corresponding lower semiconductor chip 10b.

The wiring patterns 120b can include a plurality of bottom wiring patterns 122b on the bottom surface of the substrate base 110e and a plurality of top wiring patterns 124b on the top surface of the substrate base 110e. The bottom wiring patterns 122b can include a plurality of terminal pads OPAD, a plurality of lower bonding pads PAD1, and a plurality of first upper bonding pads PAD2L. The top wiring patterns 124b can include a plurality of second upper bonding pads PAD2U.

A plurality of external connection terminals 500 can be respectively attached to the terminal pads OPAD. A plurality of lower bonding wires 310 can be respectively connected to the lower bonding pads PAD1.

A first group of upper bonding wires 320 can be respectively connected to the first upper bonding pads PAD2L, and a second group of bonding wires 320 can be respectively connected to the second upper bonding pads PAD2U. For example, the first group of upper bonding wires 320, which may transmit a signal at a relatively high speed, may be respectively connected to the first upper bonding pads PAD2L, and the second group of bonding wires 320, which may transmit a signal, power, and/or ground at a relatively low speed, may be respectively connected to the second upper bonding pads PAD2U.

Figure 10A:
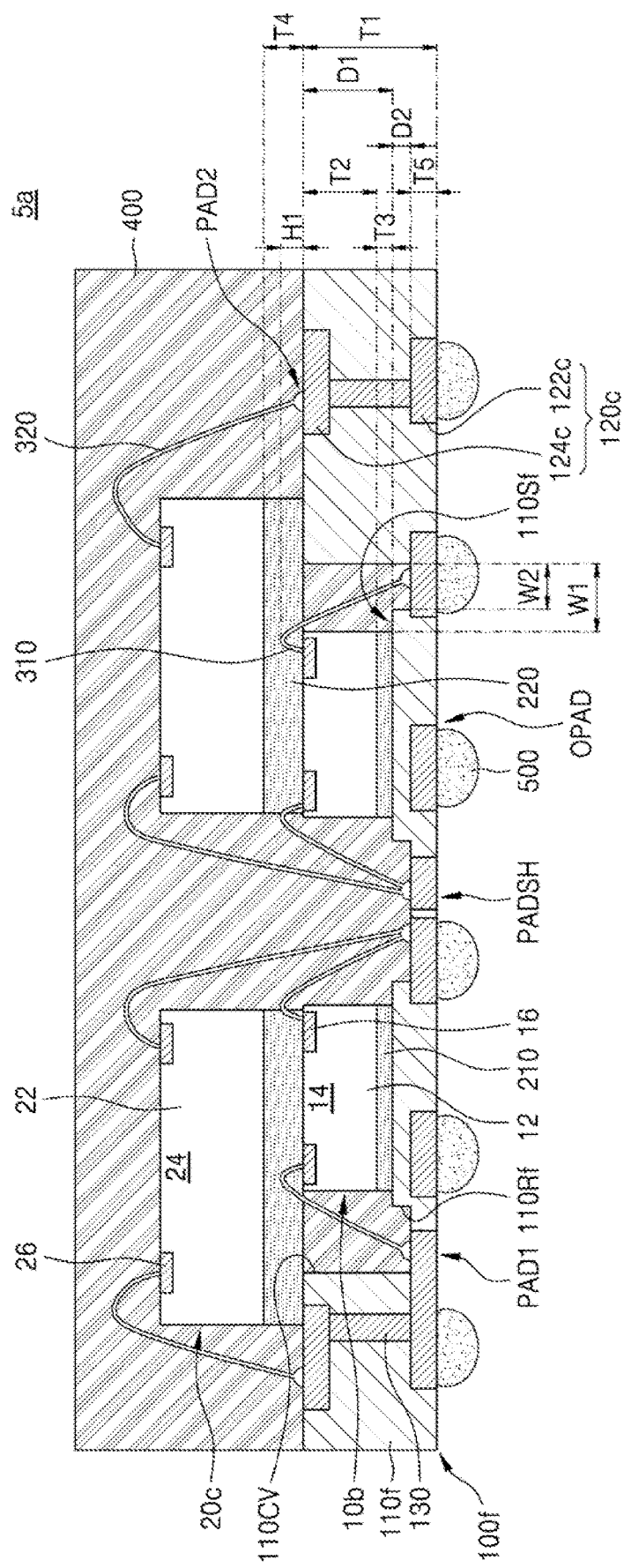
FIGS. 10A and 10B are respectively a cross-sectional view and a plan view of a semiconductor package according to an embodiment of the inventive concept.
Figure 10B:
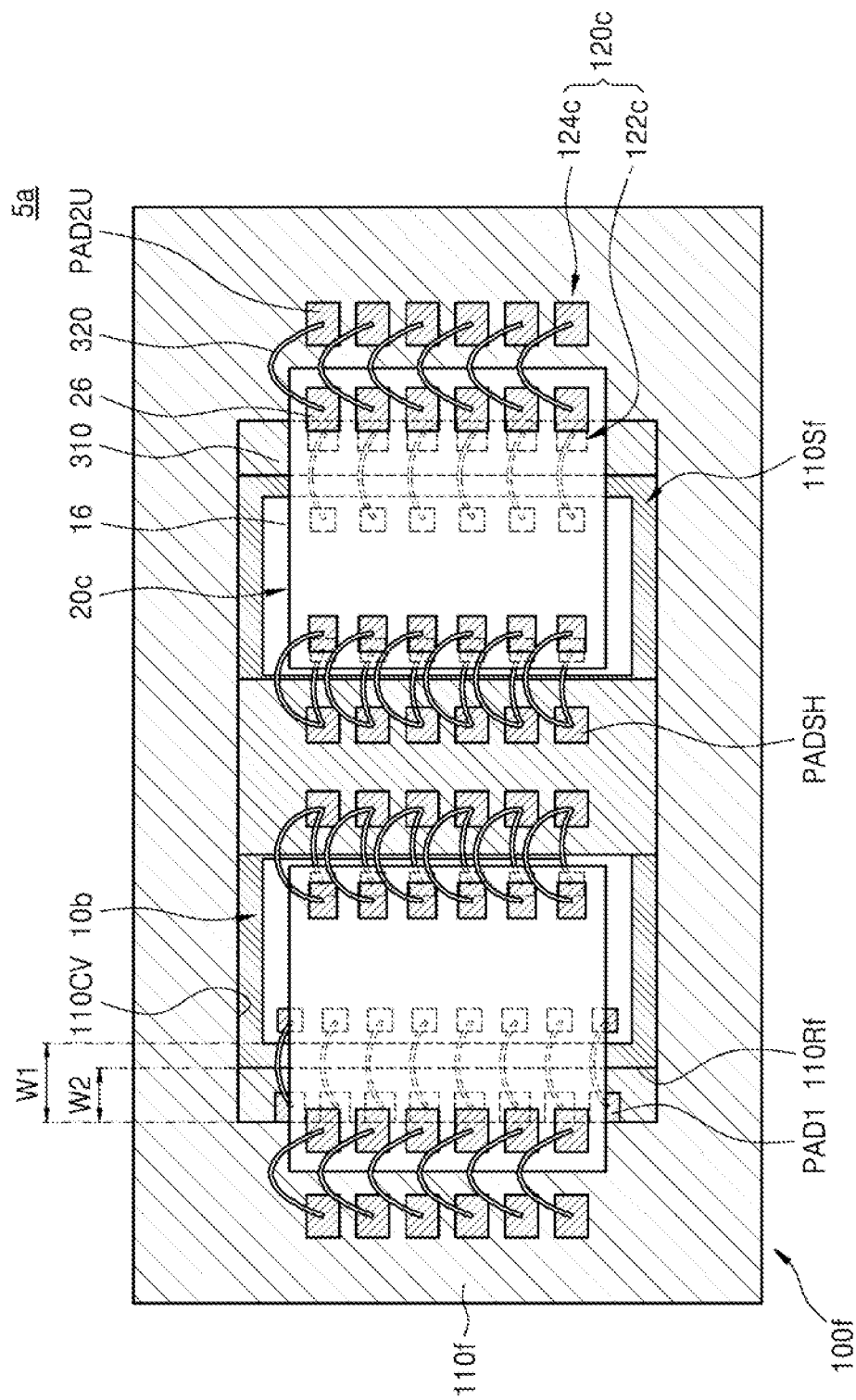

FIGS. 10A and 10B are respectively a cross-sectional view and a plan view of a semiconductor package 5a according to an embodiment of the inventive concept. In FIGS. 1A through 10B, like reference numerals may denote like elements, and redundant descriptions thereof may be omitted.

Referring to FIGS. 10A and 10B, the semiconductor package 5a can include a package substrate 100f, at least two lower semiconductor chips 10b disposed in the package substrate 100f, and at least two upper semiconductor chips 20c stacked on the package substrate 100f and the lower semiconductor chips 10b.

The package substrate 100f can include a substrate base 110f, a plurality of wiring patterns 120c, and a plurality of conductive vias 130. The substrate base 110f can include the chip-accommodating cavity 110CV and at least one bonding recess 110Rf which can contact the chip-accommodating cavity 110CV. The substrate base 110f can include at least two chip supports 110Sf, which can be defined by the chip-accommodating cavity 110CV and the bonding recess 110Rf. The chip supports 110Sf can each have a rectangular shape and can be spaced apart from each other.

Each of the lower semiconductor chips 10b can be attached to a corresponding chip support 110Sf by the lower die adhesive film 210, which can be disposed therebetween. Each of the upper semiconductor chips 20c can be attached across the package substrate 100f and a corresponding lower semiconductor chip 10b by an upper die adhesive film 220 which can be disposed between each upper semiconductor chip 20c and between each of the package substrate 100f and the corresponding lower semiconductor chip 10b.

The wiring patterns 120c can include a plurality of bottom wiring patterns 122c on the bottom surface of the substrate base 110f and a plurality of top wiring patterns 124c on the top surface of the substrate base 110f. The bottom wiring patterns 122c can include a plurality of terminal pads OPAD, a plurality of lower bonding pads PAD1, and a plurality of common bonding pads PADSH. The top wiring patterns 124c can include a plurality of upper bonding pads.

A plurality of external connection terminals 500 can be respectively attached to the terminal pads OPAD. A first group of lower bonding wires 310 can be respectively connected to the lower bonding pads PAD1. A first group of upper bonding wires 320 can be respectively connected to the upper bonding pads PAD2.

A second group of lower bonding wires 310 and a second group of upper bonding wires 320 can be connected to the common bonding pads PADSH. In other words, a lower bonding wire 310 and an upper bonding wire 320 can be connected in common to a common bonding pad PADSH. In some embodiments, a signal, which can be transmitted in common to a lower semiconductor chip 10b and an upper semiconductor chip 20c, power, and/or ground can be connected to each of the common bonding pads PADSH. In some embodiments, the lower semiconductor chip 10b can be electrically connected to the upper semiconductor chip 20c via a plurality of common bonding pads PADSH.

While the inventive concept has been particularly shown and described with reference to embodiments thereof, it will be understood that various changes in form and details can be made therein without departing from the spirit and scope of the following claims.

What is claimed is:
1. A semiconductor package comprising:
a package substrate which includes a substrate base and a plurality of wiring patterns, wherein the substrate base includes a chip-accommodating cavity, and wherein the plurality of wiring patterns include a plurality of bottom wiring patterns on a bottom surface of the substrate base and a plurality of top wiring patterns on a top surface of the substrate base;
a lower semiconductor chip which is disposed in the chip-accommodating cavity and is connected to the plurality of bottom wiring patterns through a plurality of lower bonding wires; and
an upper semiconductor chip, wherein the upper semiconductor chip includes:
a first portion which is attached to the lower semiconductor chip via an adhesive film directly contacting the upper semiconductor chip and the lower semiconductor chip, and
a second portion which overhangs the lower semiconductor chip,
wherein the upper semiconductor chip is attached across a top surface of the lower semiconductor chip and a topmost surface of the substrate base, and
wherein the top surface of the lower semiconductor chip is disposed at a same vertical level as the topmost surface of the substrate base.

2. The semiconductor package of claim 1, wherein the upper semiconductor chip is connected to the plurality of wiring patterns through a plurality of upper bonding wires.

3. The semiconductor package of claim 2, further comprising a molding layer which fills the chip-accommodating cavity and covers the lower semiconductor chip, the plurality of lower bonding wires, the upper semiconductor chip, and the plurality of upper bonding wires.

4. The semiconductor package of claim 1, wherein:
the substrate base further includes at least one bonding recess which contacts the chip-accommodating cavity;
the plurality of bottom wiring patterns include:
a plurality of terminal pads which are disposed at a same vertical level as each other, and
a plurality of lower bonding pads which are disposed in a bottom of the at least one bonding recess; and
the plurality of terminal pads are attached to a plurality of external connection terminals, and the plurality of lower bonding pads are connected to the plurality of lower bonding wires.

5. The semiconductor package of claim 4, wherein the bottom of the at least one bonding recess is disposed at a vertical level which is lower than a bottom of the chip-accommodating cavity and is higher than the bottom surface of the substrate base.

6. The semiconductor package of claim 5, wherein a portion of the substrate base and the plurality of lower bonding pads are disposed in the bottom of the at least one bonding recess.

7. The semiconductor package of claim 4, wherein the bottom of the at least one bonding recess is disposed at a vertical level which is lower than a bottom of the chip-accommodating cavity and is equal to the bottom surface of the substrate base.

8. The semiconductor package of claim 7, wherein the at least one bonding recess includes a plurality of bonding recesses which correspond to the plurality of lower bonding pads.

9. The semiconductor package of claim 4, wherein:
the substrate base further includes a chip support which is defined by the chip-accommodating cavity and the at least one bonding recess;
the lower semiconductor chip is attached to the chip support by a lower die adhesive film which is disposed between the lower semiconductor chip and the chip support, wherein the lower die adhesive film has a first thickness;
the adhesive film is disposed between the upper semiconductor chip and the lower semiconductor chip, wherein the adhesive film has a second thickness greater than the first thickness; and
at least one of a plurality of lower bonding wires connected to a plurality of first chip pads on a top surface of the lower semiconductor chip are partially covered by the adhesive film.

10. A semiconductor package comprising:
a package substrate which includes a substrate base and a plurality of wiring patterns, wherein the substrate base includes a chip-accommodating cavity, a bonding recess which contacts the chip-accommodating cavity and includes a bottom which is disposed at a vertical level lower than a bottom of the chip-accommodating cavity, and a chip support which is defined by the chip-accommodating cavity and the bonding recess, and wherein the plurality of wiring patterns include a plurality of bottom wiring patterns on a bottom surface of the substrate base and a plurality of top wiring patterns on a top surface of the substrate base, the plurality of bottom wiring patterns include a plurality of terminal pads which are disposed at a same vertical level as each other and a plurality of lower bonding pads which are disposed in the bottom of the bonding recess, and the plurality of top wiring patterns include a plurality of upper bonding pads;
a lower semiconductor chip which is disposed in the chip-accommodating cavity and includes a plurality of first chip pads on a top surface thereof, wherein the lower semiconductor chip is attached to the chip support by a lower die adhesive film which has a first thickness between the lower semiconductor chip and the chip support;
an upper semiconductor chip which includes a plurality of second chip pads on a top surface thereof and is attached across the top surface of the lower semiconductor chip and the top surface of the substrate base by an upper die adhesive film which has a second thickness between the upper semiconductor chip and the top surfaces of the lower semiconductor chip and the substrate base, wherein the second thickness is greater than the first thickness;
a plurality of lower bonding wires which connect the plurality of lower bonding pads to the plurality of first chip pads, wherein at least one of the plurality of lower bonding wires is partially covered by the upper die adhesive film;
a plurality of upper bonding wires which connect the plurality of upper bonding pads to the plurality of second chip pads;

a molding layer which covers a top surface of the package substrate, fills the chip-accommodating cavity and the bonding recess, and covers the lower semiconductor chip, the plurality of lower bonding wires, the upper semiconductor chip, and the plurality of upper bonding wires; and a plurality of external connection terminals which are attached to the plurality of terminal pads.

11. The semiconductor package of claim 10, wherein the lower semiconductor chip is separated, by at least about 100 nm, from a side wall of the chip-accommodating cavity, wherein the bonding recess is located between the lower semiconductor chip and the side wall of the chip-accommodating, cavity.

12. The semiconductor package of claim 10, wherein the chip-accommodating cavity has a depth of about 100 μm to about 150 μm, wherein the depth is less than a thickness of the lower semiconductor chip.

* * * * *